(12) United States Patent
Takagi et al.

(10) Patent No.: US 8,125,817 B2
(45) Date of Patent: Feb. 28, 2012

(54) NONVOLATILE STORAGE DEVICE AND METHOD FOR WRITING INTO THE SAME

(75) Inventors: Takeshi Takagi, Kyoto (JP); Shunsaku Muraoka, Osaka (JP); Ryotaro Azuma, Osaka (JP); Kunitoshi Aono, Kyoto (JP)

(73) Assignee: Panasonic Corporation, Osaka (JP)

( * ) Notice: Subject to any disclaimer, the term of this patent is extended or adjusted under 35 U.S.C. 154(b) by 62 days.

(21) Appl. No.: 12/867,392

(22) PCT Filed: Dec. 16, 2009

(86) PCT No.: PCT/JP2009/006917
§ 371 (c)(1),
(2), (4) Date: Aug. 12, 2010

(87) PCT Pub. No.: WO2010/070895
PCT Pub. Date: Jun. 24, 2010

(65) Prior Publication Data
US 2010/0321982 A1 Dec. 23, 2010

(30) Foreign Application Priority Data
Dec. 18, 2008 (JP) ................................. 2008-322136

(51) Int. Cl.
*G11C 11/00* (2006.01)
*G11C 5/06* (2006.01)
*G11C 11/34* (2006.01)
*G11C 5/14* (2006.01)
*G11C 7/00* (2006.01)

(52) U.S. Cl. .......... 365/148; 365/63; 365/163; 365/174; 365/189.09; 365/189.16

(58) Field of Classification Search .................. 365/148, 365/63, 163, 174, 189.09, 189.16
See application file for complete search history.

(56) References Cited

U.S. PATENT DOCUMENTS
2003/0001178 A1   1/2003   Hsu et al.
(Continued)

FOREIGN PATENT DOCUMENTS
JP   10-303370   11/1998
(Continued)

OTHER PUBLICATIONS
International Search Report issued Mar. 30, 2010 in International (PCT) Application No. PCT/JP2009/006917.

*Primary Examiner* — Ly D Pham
(74) *Attorney, Agent, or Firm* — Wenderoth, Lind & Ponack, LLP

(57) ABSTRACT

To provide a nonvolatile storage device (100) which is capable of achieving stable operation and includes variable resistance elements. The nonvolatile storage device (100) includes: memory cells (M111, M112, . . .) each of which is provided at three-dimensional cross-points between word lines (WL0, WL1, . . .) and bit lines (BL0, BL1, . . .) and having a resistance value that reversibly changes based on an electrical signal; a row selection circuit-and-driver (103) provided with transistors (103a) each of which applies a predetermined voltage to a corresponding one of the word lines (WL0, WL1, . . .); a column selection circuit-and-driver (104) provided with transistors (104a) each of which applies a predetermined voltage to a corresponding one of the bit lines (BL0, BL1, . . .); and a substrate bias circuit (110) which applies a forward bias voltage to a substrate of such transistors (103a and 104a).

13 Claims, 25 Drawing Sheets

U.S. PATENT DOCUMENTS

| | | |
|---|---|---|
| 2003/0003674 A1 | 1/2003 | Hsu et al. |
| 2003/0003675 A1 | 1/2003 | Hsu |
| 2003/0142578 A1 | 7/2003 | Hsu et al. |
| 2003/0203585 A1 | 10/2003 | Hsu |
| 2003/0206481 A1 | 11/2003 | Hsu et al. |
| 2004/0027907 A1 | 2/2004 | Ooishi |
| 2004/0108528 A1 | 6/2004 | Hsu et al. |
| 2004/0164332 A1 | 8/2004 | Hsu et al. |
| 2004/0170048 A1 | 9/2004 | Hsu |
| 2004/0174728 A1 | 9/2004 | Takano et al. |
| 2004/0264244 A1 | 12/2004 | Morimoto |
| 2005/0052942 A1 | 3/2005 | Hsu et al. |
| 2005/0054138 A1 | 3/2005 | Hsu et al. |
| 2005/0083757 A1 | 4/2005 | Hsu et al. |
| 2005/0141269 A1 | 6/2005 | Hsu et al. |
| 2005/0207248 A1 | 9/2005 | Hsu |
| 2006/0094187 A1 | 5/2006 | Hsu et al. |
| 2008/0175032 A1 | 7/2008 | Tanaka et al. |
| 2009/0273964 A1 | 11/2009 | Yamazaki et al. |
| 2009/0283736 A1 | 11/2009 | Kanzawa et al. |

FOREIGN PATENT DOCUMENTS

| | | |
|---|---|---|
| JP | 2003-68984 | 3/2003 |
| JP | 2004-79033 | 3/2004 |
| JP | 2005-25914 | 1/2005 |
| JP | 2007-172826 | 7/2007 |
| JP | 2008-123690 | 5/2008 |
| JP | 2008-147343 | 6/2008 |
| JP | 2008-181978 | 8/2008 |
| JP | 2008-243263 | 10/2008 |
| JP | 2008-305888 | 12/2008 |
| JP | 2008-305889 | 12/2008 |
| JP | 2009-135370 | 6/2009 |
| JP | 2010-73236 | 4/2010 |
| WO | 2007/102212 | 9/2007 |
| WO | 2008/149484 | 12/2008 |

FIG. 2
(a) 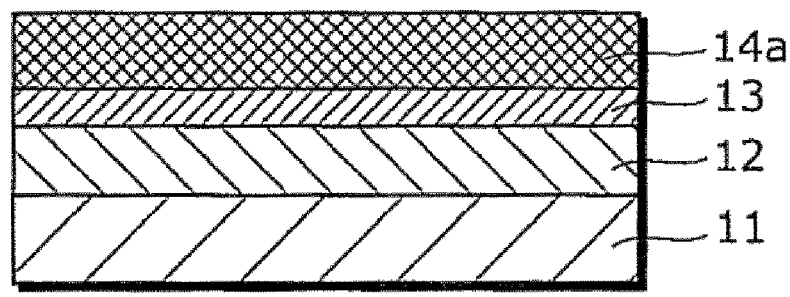
(b) 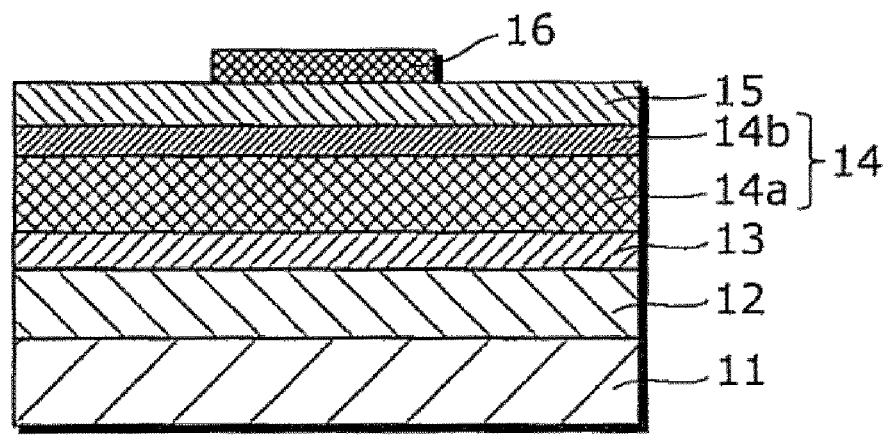
(c) 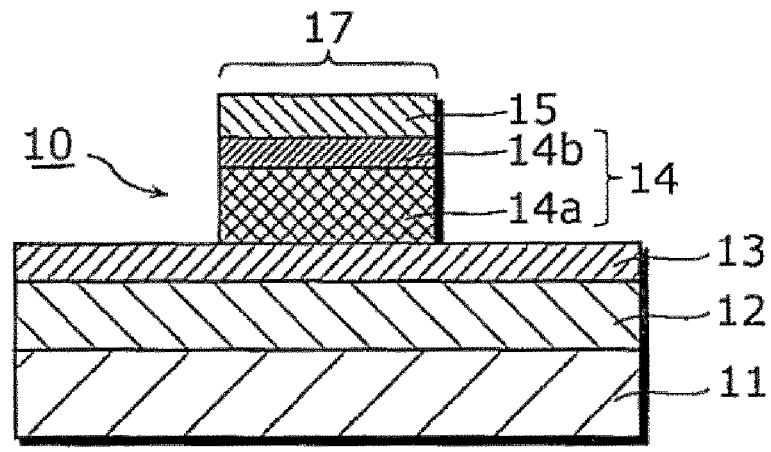

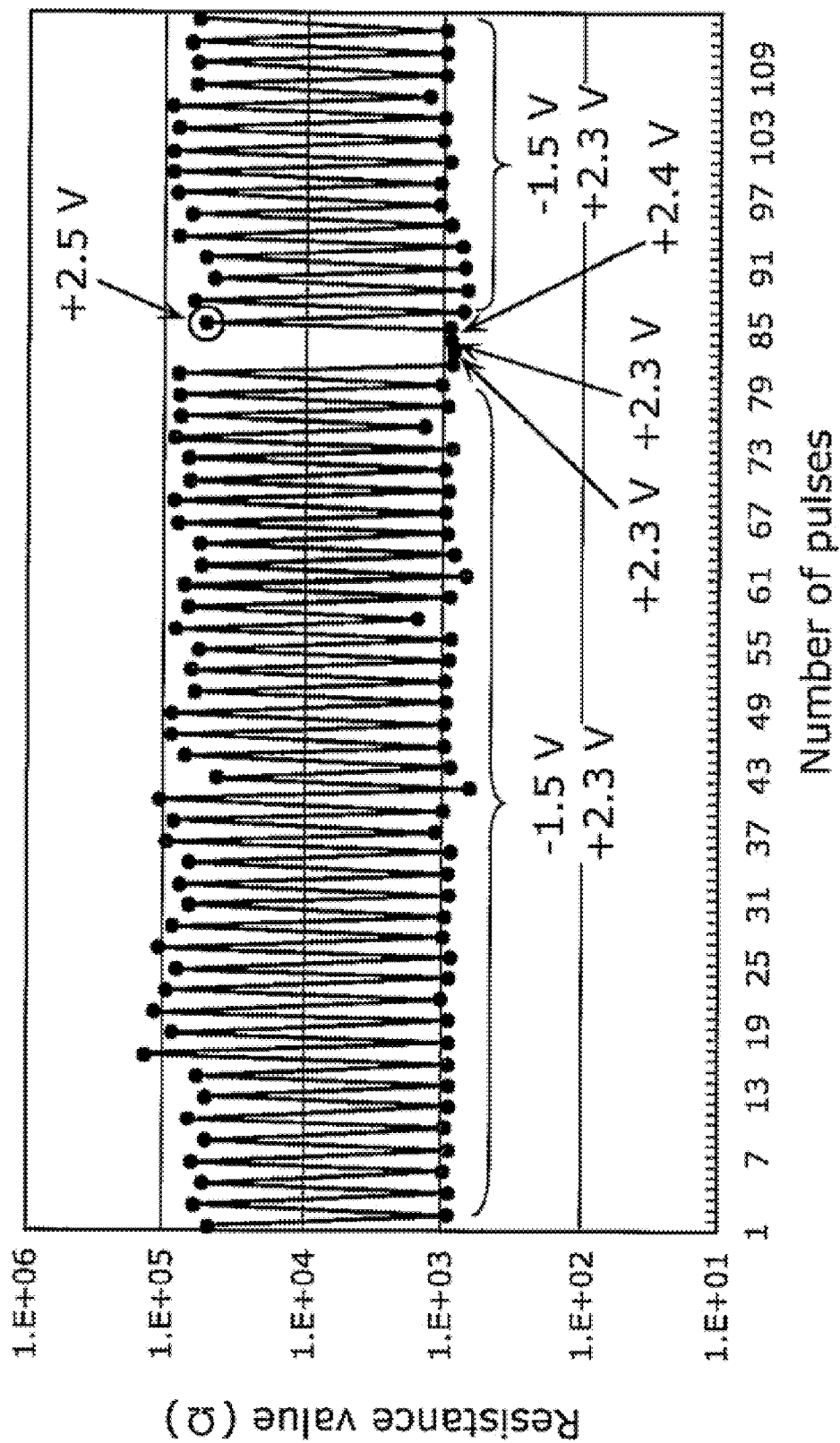

FIG. 26
(a) Bidirectional memory cell
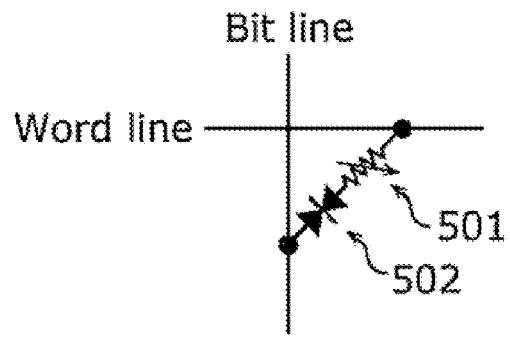
(b) Unidirectional memory cell
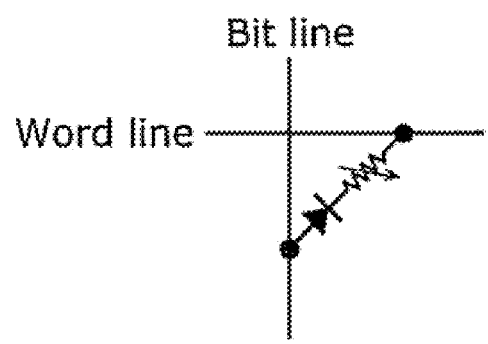
(c) Diode-less memory cell
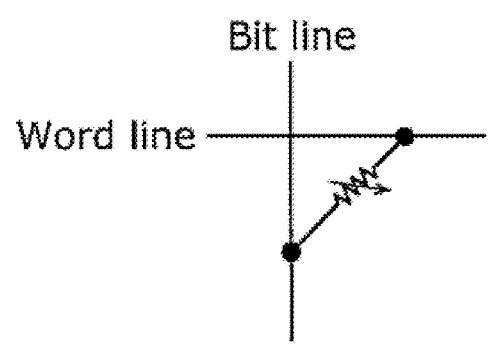

NONVOLATILE STORAGE DEVICE AND METHOD FOR WRITING INTO THE SAME

TECHNICAL FIELD

The present invention relates to a nonvolatile storage device having variable resistance nonvolatile storage elements (variable resistance elements) whose resistance value reversibly changes based on electrical signals, and to a method for writing into the same.

BACKGROUND ART

Recent years have seen increased high performance in electronic devices such as mobile information devices and information appliances following the development of digital technology. As such, there is an increasing demand for higher-capacity, reduced writing power consumption, increased speed during writing and reading, and extended operational life of nonvolatile storage elements.

In view of these demands, it is considered that there is a limit to the miniaturization of flash memories using existing floating gates. On the other hand, in the case of variable resistance nonvolatile storage elements using a variable resistance layer as a material for a storage unit, there are expectations for further miniaturization, increased speed, reduced power consumption, and so on, since configuration is possible using storage elements having a simple structure in which the variable resistance layer is sandwiched between a lower electrode and an upper electrode.

As an example of such a nonvolatile storage device using variable resistance elements, the cross-point nonvolatile storage device has been proposed (for example, PTL 1). This nonvolatile storage device includes memory cells (variable resistance elements) provided in a matrix to correspond to cross-points between word lines that are arranged to be parallel to each other and bit lines which are arranged so as to cross the respective word lines. Each memory cell is provided with a variable resistance layer whose resistance value changes according to an electrical signal provided between the word line and the bit line.

In the case of such a cross-point nonvolatile storage device, since a transistor does not need to be provided to each memory cell, there is the advantage of allowing the implementation of high-density placement of cells.

[Citation List]
[Patent Literature]

[PTL 1] Japanese Unexamined Patent Application Publication No. 2003-68984

SUMMARY OF INVENTION

[Technical Problem]

Meanwhile, in order for the nonvolatile storage device including such variable resistance elements to stably operate, it is necessary to reliably change the resistance value of the variable resistance layer in each of the variable resistance elements. To reliably change the resistance value of each variable resistance layer, there are cases where it is necessary to temporarily apply, to the variable resistance element, a higher voltage than the voltage used in normal writing.

As stated above, to apply a higher voltage than the voltage used in normal writing to the variable resistance element, it is conceivable to increase a size of a driving transistor (gate width, and so on) in a word line driving circuit and a bit line driving circuit which apply voltage for writing to the word lines and bit lines, respectively. However, increasing the size of such transistors leads to an increase in the size of the above-mentioned word line driving circuit and bit line driving circuit, and is thus not desirable.

The present invention has been conceived in view of such a situation, and has a main object to provide a cross-point nonvolatile storage device capable of realizing stable operation without increasing the size of the driving circuits of the word lines and the bit lines, and a method for writing into the same.

[Solution to Problem]

In order to solve the aforementioned problem, a nonvolatile storage device according to an aspect of the present invention includes: a substrate; first wires formed parallel to each other on the substrate; second wires formed above the first wires so as to be parallel to each other on a plane parallel to a main plane of the substrate and to three-dimensionally cross the first wires; a memory cell array which includes variable resistance elements each of which (i) is provided to correspond to one of cross-points between the first wires and the second wires, (ii) is interposed between corresponding ones of the first wires and the second wires, and (iii) whose resistance state reversibly changes between a low resistance state and a high resistance state based on a polarity of a voltage applied between the corresponding ones of the first wires and the second wires, the cross-points being three-dimensional; a selection circuit which (i) includes: a first driving circuit provided with transistors each of which applies a predetermined voltage to a corresponding one of the first wires; and a second driving circuit provided with transistors each of which applies a predetermined voltage to a corresponding one of the second wires, and (ii) selects at least one of the variable resistance elements from the memory cell array, using the first driving circuit and the second driving circuit; a substrate bias circuit which applies a bias voltage to the substrate on which the transistors provided to the first driving circuit and the second driving circuit are formed; and a write circuit which provides an electrical signal for writing, to the variable resistance element selected by the selection circuit, wherein each of the transistors provided to the first driving circuit and the second driving circuit is formed in a region of a first conductivity type within the substrate and includes a first diffusion region of a second conductivity type having reverse polarity to the first conductivity type, a gate, and a second diffusion region of the second conductivity type, and when the electrical signal for writing is provided by the write circuit to the variable resistance element selected by the selection circuit, the substrate bias circuit applies the bias voltage to the region of the first conductivity type in the substrate on which at least one of the transistors provided to the first driving circuit and the transistors provided to the second driving circuit is formed, the bias voltage being applied in a forward direction with respect to the first diffusion region and the second diffusion region.

Accordingly, at the time of writing into a variable resistance element, the bias voltage is applied to the substrate on which the driving transistors included in the selection circuit that selects such variable resistance element are formed, in a forward direction with respect to the driving transistors, and thus the substrate biasing effect reduces the on-resistance of such driving transistors and a voltage that is higher by as much as the amount of the decrease is applied to the variable resistance element. As a result, it is possible to reliably change the resistance value of the variable resistance element without increasing the gate width of the respective driving transistors. Therefore, a cross-point nonvolatile storage device capable of achieving stable operation can be realized without increasing the size of the driving circuits of the word lines and the bit lines.

It is to be noted that, for the magnitude of a bias voltage, the voltage may be lower than a threshold voltage with which a current flows from a connected P-type semiconductor to an N-type semiconductor.

Here, the substrate bias circuit may apply the bias voltage in the case where a resistance value of the variable resistance element selected by the selection circuit is an initial resistance value which is a resistance value in the case where a voltage pulse has not yet been applied since manufacturing of the variable resistance element. Stated differently, the writing into a variable resistance element in which substrate biasing is performed may be limited to the case of initializing (or breaking down) the variable resistance element. With this, in an initialization process which requires a higher voltage than in normal writing, the substrate biasing effect reduces the on-resistance of the driving transistors and causes a voltage that is higher by the amount of the reduction to be applied to the variable resistance element, and thus the initialization process is more reliably performed.

Furthermore, the substrate bias circuit may apply the bias voltage when causing the resistance state of the variable resistance element selected by the selection circuit to change from the low resistance state to the high resistance state. Stated differently, the writing into a variable resistance element in which substrate biasing is performed may be limited to the case of changing the resistance state of the variable resistance element from the low resistance state to the high resistance state (that is, resistance change to high resistance state or HR writing for short). With this, in the HR writing, the substrate biasing effect reduces the on-resistance of the driving transistors and causes a voltage that is higher by the amount of the reduction to be applied to the variable resistance element, and thus suppressing the variation in the resistance value of the variable resistance element in the high resistance state which is unstable compared to that in the low resistant state.

Furthermore, the substrate bias circuit may apply the bias voltage when additional writing is to be performed on the variable resistance element selected by the selection circuit, after writing to change the resistance state of the variable resistance element fails. Stated differently, the writing into a variable resistance element in which substrate biasing is performed may be limited to the case of performing additional writing on the variable resistance element. With this, in the additional writing which requires a higher voltage than in normal writing, the substrate bias effect reduces the on-resistance of the driving transistors and causes a voltage that is higher by the amount of the reduction to be applied to the variable resistance element, and thus the additional writing is accomplished more reliably (or with fewer cyclings).

Furthermore, the substrate bias circuit may apply the bias voltage when a number of cyclings of writing into the variable resistance element selected by the selection circuit reaches a predetermined number of cyclings. Stated differently, the writing into a variable resistance element in which substrate biasing is performed may be limited to the refresh process, that is, a case where the writing is performed with a higher voltage for writing upon reaching a certain number of cyclings. With this, in the refresh process which requires a higher voltage than in normal writing, the substrate bias effect reduces the on-resistance of the selection transistor and causes a voltage that is higher by the amount of the reduction to be applied to the variable resistance element, and thus the refresh process is more reliably performed.

Furthermore, the region of the first conductivity type in the substrate may be a well of the first conductivity type formed in the substrate, and the substrate bias circuit may apply the bias voltage to the well. In other words, the transistors included in the driving circuits may be formed within the well formed in the semiconductor substrate. With this, substrate biasing can be performed by applying the bias voltage to the well, and thus substrate biasing can be performed while the substrate itself is fixed to another potential (ground, for example).

Furthermore, each of the variable resistance elements may include a metal oxide having a resistance state that reversibly changes between the low resistance state and the high resistance state based on the polarity of the voltage applied between the corresponding ones of the first wires and the second wires. With this, it is possible to realize a variable resistance element in which resistance changing occurs stably.

Furthermore, the second wires may be bit lines which extend in an X-direction on the plane that is parallel to the main plane of the substrate and are formed into layers stacked in a Z-direction that is perpendicular to the main plane of the substrate, the first wires may be word lines which are formed between the layers of the bit lines and extend in a Y-direction that is orthogonal to the X-direction on the plane that is parallel to the main plane of the substrate, each of the variable resistance elements may be formed, in a corresponding one of cross-points between the bit lines and the word lines, between the corresponding ones of the bit lines and the word lines, basic array planes may be lined-up in the Y-direction and have common word lines, each of the basic array planes being formed by a group of the bit lines that are stacked in the Z-direction, in each of the basic array planes, even layers of the bit lines may be connected in common and odd layers of the bit lines may be connected in common, the nonvolatile storage device may further include: global bit lines; and first selection switching elements, each of which is provided in a corresponding one of the basic array planes, and second selection switching elements, each of which is provided in the corresponding one of the basic array planes, each of the first selection switching elements may control, according to an even-layer selection signal, switching between electrical connection and non-connection between one of the global bit lines for the corresponding basic array plane and the even layers of the bit lines connected in common in the corresponding basic array plane, each of the second selection switching elements may control, according to an odd-layer selection signal, switching between electrical connection and non-connection between one of the global bit lines for the corresponding basic array plane and the odd layers of the bit lines connected in common in the corresponding basic array plane, and the substrate bias circuit may further apply the bias voltage to the substrate on which the first selection transistor and the second selection transistor are formed, when an electrical signal for writing is provided to the even layers or the odd layers of the bit lines that are connected in common in one of the basic array planes that is selected.

Accordingly, by applying the substrate biasing to the driving transistors and the selection transistors of which a large number is required for a memory cell array having a multi-layer structure, an ultra-high-capacity nonvolatile storage device can be realized.

It is to be noted that the present invention can be realized not only as the nonvolatile storage device but also as a method for writing into the memory cells (more specifically, the variable resistance elements) in the nonvolatile storage device.

Specifically, the writing method according to an aspect of the present invention is a writing method of writing into variable resistance elements included in a nonvolatile storage device, the method including: a step of selecting at least one variable resistance element from the variable resistance elements included in a memory cell array, using a first driving circuit and a second driving circuit, each of the variable resistance elements (i) being provided, on a substrate, to correspond to one of cross-points between first wires and second wires, (ii) being interposed between corresponding ones of the first wires and the second wires, and (iii) having a resistance state that reversibly changes between a low resistance state and a high resistance state based on a polarity of a voltage applied between the corresponding ones of the first wires and the second wires, the first driving circuit being provided with transistors each of which applies a predetermined voltage to a corresponding one of the first wires, and the second driving circuit being provided with transistors each of which applies another predetermined voltage to a corresponding one of the second wires; a step of applying a bias voltage to the substrate on which the transistors provided to the first driving circuit and the second driving circuit are formed; and a step of providing an electrical signal for writing to the variable resistance element selected in the step of selecting, wherein each of the transistors provided to the first driving circuit and the second driving circuit are formed in a region of a first conductivity type within the substrate and includes a first diffusion region of a second conductivity type having a reverse polarity to the first conductivity type, a gate, and a second diffusion region of the second conductivity type, and in the step of applying a bias voltage to the substrate, when the electrical signal for writing is provided in the step of providing an electrical signal for writing to the variable resistance element selected in the step of selecting, the bias voltage is applied to the region of the first conductivity type in the substrate on which at least one of the transistors provided to the first driving circuit and the transistors provided to the second driving circuit is formed, the bias voltage being applied in a forward direction with respect to the first diffusion region and the second diffusion region.

Accordingly, at the time of writing into a variable resistance element, the bias voltage is applied to the substrate on which the driving transistors included in the selection circuit that selects such variable resistance element are formed, in a forward direction with respect to the driving transistors, and thus the substrate biasing effect reduces the on-resistance of such driving transistors and a voltage that is higher by as much as the amount of the decrease is applied to the variable resistance element. As a result, it is possible to reliably change the resistance value of the variable resistance element without increasing the gate width of the respective driving transistors.

Here, in the step of applying a bias voltage to the substrate, the bias voltage may be applied in the case where a resistance value of the variable resistance element selected in the step of selecting is an initial resistance value which is a resistance value at a time when a voltage pulse has not yet been applied since manufacturing of the variable resistance element. With this, in an initialization process which requires a higher voltage than in normal writing, the substrate biasing effect reduces the on-resistance of the driving transistors and causes a voltage that is higher by the amount of the reduction to be applied to the variable resistance element, and thus the initialization process is more reliably performed.

Furthermore, in the step of applying a bias voltage to the substrate, the bias voltage may be applied when causing the resistance state of the variable resistance element selected in the selecting to change from the low resistance state to the high resistance state. With this, in the HR writing, the substrate biasing effect reduces the on-resistance of the driving transistors and causes a voltage that is higher by the amount of the reduction to be applied to the variable resistance element, and thus suppressing the variation in the resistance value of the variable resistance element in the high resistance state which is unstable compared to that in the low resistant state.

Furthermore, in the step of applying a bias voltage to the substrate, the bias voltage may be applied when additional writing is to be performed on the variable resistance element selected in the step of selecting, after writing to change the resistance state of the variable resistance element fails. With this, in the additional writing which requires a higher voltage than in normal writing, the substrate bias effect reduces the on-resistance of the driving transistors and causes a voltage that is higher by the amount of the reduction to be applied to the variable resistance element, and thus the additional writing is accomplished more reliably (or with fewer cyclings).

Furthermore, in the step of applying a bias voltage to the substrate, the bias voltage may be applied when a number of cyclings of writing into the variable resistance element selected in the step of selecting reaches a predetermined number of cyclings. With this, in the refresh process which requires a higher voltage than in normal writing, the substrate bias effect reduces the on-resistance of the selection transistor and causes a voltage that is higher by the amount of the reduction to be applied to the variable resistance element, and thus the refresh process is more reliably performed.

[Advantageous Effects of Invention]

According to the nonvolatile storage device and the method for writing into the same according to the present invention, it is possible to generate a sufficient voltage to change the resistance value of variable resistance elements without increasing the size of the driving transistor in the driving circuits of the memory cell array. Therefore, since the resistance value of the resistance elements can be reliably changed, it is possible to implement stable operation without increasing the chip size of the memory.

Therefore, it is possible to further integrate nonvolatile storage devices, and the practical implication of the present invention is quite significant.

BRIEF DESCRIPTION OF DRAWINGS

FIG. 2 (a) to (c) are cross-sectional views showing a manufacturing process of the nonvolatile storage element used in a nonvolatile storage device according to Embodiment 1 of the present invention.

FIG. 15 is a graph showing a change of a resistance state caused by additional writing into a single variable resistance element.

FIG. 26 (a) to (c) are circuit diagrams of various memory cells that can be used in the respective embodiments of the present invention.

DESCRIPTION OF EMBODIMENTS

The following describes the preferred embodiments of the present invention with reference to the drawings.

(Embodiment 1)

First, a nonvolatile storage device according to Embodiment 1 of the present invention shall be described.

(Configuration of Variable Resistance Element)

Figure 1:
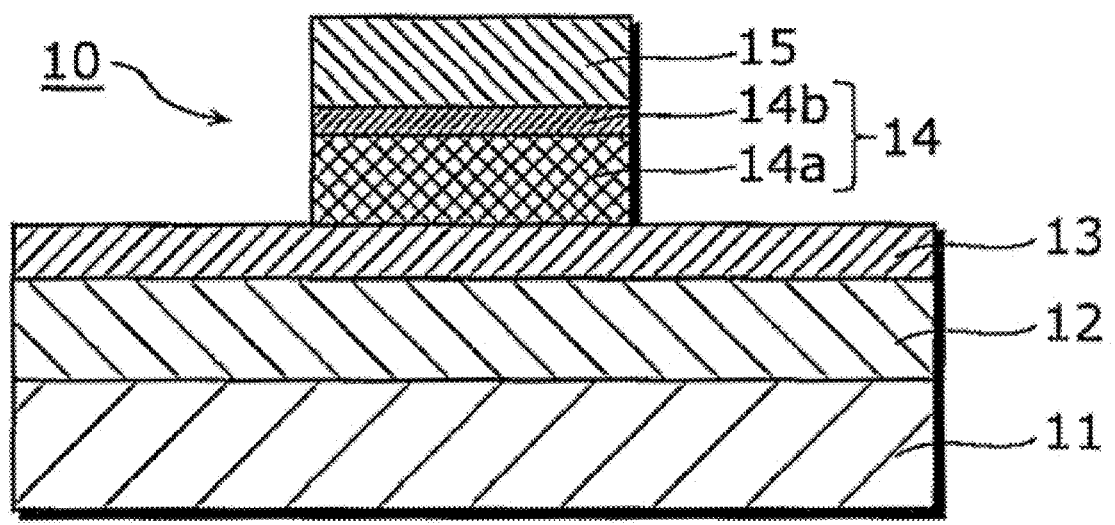
FIG. 1 is a cross-sectional view showing a configuration of a variable resistance element included in a nonvolatile storage device according to Embodiment 1 of the present invention.

FIG. 1 is a cross-sectional view showing a configuration of a variable resistance nonvolatile storage element (variable resistance element) used in a nonvolatile storage device according to Embodiment 1 of the present invention. As shown in FIG. 1, a variable resistance element 10 includes: a substrate 11; an oxide layer 12 formed on the substrate 11; a lower electrode 13 formed on the oxide layer 12; a variable resistance layer 14 formed on the lower electrode 13; and an upper electrode 15 formed on the variable resistance layer 14. The lower electrode 13 and the upper electrode 15 are electrically connected to the variable resistance layer 14. It is to be noted that although the figure shows layers below the lower electrode 13 (the substrate 11 and the oxide layer 12) as components of the variable resistance element 10, it is sufficient that the variable resistance element according to the present invention includes at least the lower electrode 13, the variable resistance layer 14, and the upper electrode 15.

For the substrate 11, for instance, a silicon single crystal substrate or a semiconductor substrate may be used. However, the substrate 11 is not limited to these substrates. The variable resistance layer 14 can be formed at a relatively low substrate temperature and thus can be formed on a resin material and the like.

The materials used in the lower electrode 13 and the upper electrode 15 are, for example, one or more of Au (gold), Pt (platinum), Ir (iridium), Pd (palladium), Ag (silver), Ni (nickel), W (tungsten), Cu (copper), and TaN (tantalum nitride), and so on.

The variable resistance layer 14 is a layer including a metal oxide whose resistance state reversibly changes between a low resistance state and a high resistance state based on a voltage pulse applied between the lower electrode 13 and the upper electrode 15, and is formed by stacking a first tantalum oxide layer 14a and a second tantalum oxide layer 14b. Here, both the first tantalum oxide layer 14a and the second tantalum oxide layer 14b are not insulating bodies, and the oxygen content percentage of the second tantalum oxide layer 14b is higher than that of the first tantalum oxide layer 14a.

It is to be noted that the above-described configuration of the variable resistance element is not only for Embodiment 1, but is also applied in the same manner in Embodiment 2 through Embodiment 6 described later.

(Manufacturing Method of Variable Resistance Element)

The variable resistance element 10 configured in the above-described manner can be manufactured in the subsequent manner.

FIG. 2 (a) to (c) are cross-sectional views of a manufacturing process of the nonvolatile storage element 10 used in a nonvolatile storage device according to Embodiment 1 of the present invention.

First, as shown in FIG. 2 (a), the oxide layer 12 having a thickness of 200 nm is formed on the substrate 11 comprising single-crystal silicon, by thermal oxidation. Then, by sputtering, a Pt thin film having a thickness of 100 nm is formed on the oxide layer 12 as the lower electrode 13. Subsequently, the first tantalum oxide layer 14a is formed on the lower electrode 13 by reactive sputtering using a Ta target.

Here, deposition of the first tantalum oxide layer 14a can be performed under the following condition. Specifically, after setting the substrate inside the sputtering apparatus; the inside of the sputtering apparatus is vacuumed to about $8 \times 10^{-6}$ Pa. Then, the sputtering is performed for 20 seconds with tantalum used as the target, power set to 1.6 kW, a flow of argon gas at 34 sccm, a flow of oxygen gas at 21 sccm, and pressure in the sputtering apparatus being kept at 0.17 Pa. With this, 30 nm of the first tantalum oxide layer having a resistivity of 6 mΩ cm and an oxygen content percentage of about 61 at % ($TaO_{1.6}$) can be deposited.

Next, as shown in FIG. 2 (b), the top surface of the first tantalum oxide layer 14a is oxidized to modify the surface property. The oxidation treatment forms the second tantalum oxide layer 14b which has a higher oxygen content percentage than the first tantalum oxide layer 14a.

Subsequently, by sputtering, a Pt thin film having a thickness of 150 nm is formed on the second tantalum oxide layer 14b as the upper electrode 15. It is to be noted that, in order to prevent the second tantalum oxide layer 14b from oxidizing in air, it is preferable that formation of the upper electrode 15 be performed immediately after the deposition of the second tantalum oxide layer 14b. Lastly, a pattern 16 which uses a photoresist is formed by a photolithography process, and an element region 17 is formed by dry etching (see FIG. 2 (c)). Here, the element region 17 can be square-shaped with each side being, for example, 0.5 μm in length.

(Configuration of Nonvolatile Storage Device)

The nonvolatile storage device in the present embodiment is a cross-point memory array in which each of variable resistance elements configured in the above-described manner is interposed at a cross-point (three-dimensional crosspoint) between a word line which is an example of a first wire and a bit line which is an example of a second wire. The variable resistance element 10 has a resistance state that reversibly changes between a low resistance state and a high resistance state based on a voltage pulse applied between the word line and the bit line. The following describes the details of the configuration of the variable resistance element 10.

It is to be noted that the configuration of the nonvolatile storage device in the present embodiment is applied in the same manner in Embodiment 2 through Embodiment 6.

Figure 3:
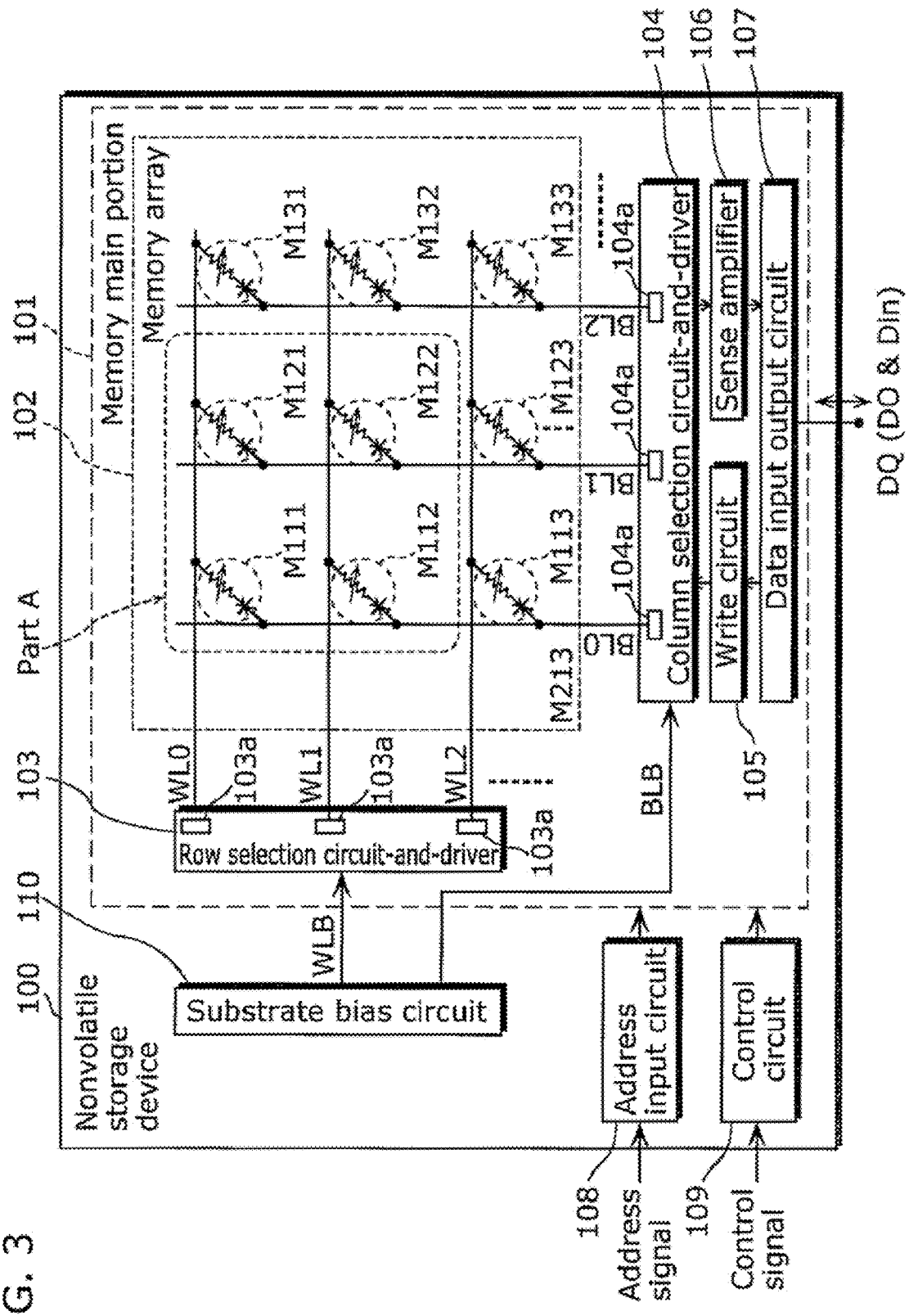
FIG. 3 is a block diagram showing a configuration of the nonvolatile storage device according to Embodiment 1 of the present invention.

FIG. 3 is a block diagram showing a configuration of the nonvolatile storage device according to Embodiment 1 of the present invention. Furthermore, FIG. 4 is a perspective view showing a configuration of part A (configuration for four bits) in FIG. 3.

As shown in FIG. 3, a nonvolatile storage device 100 according to the present embodiment includes a memory main portion 101 on a semiconductor substrate. The memory main portion 101 includes: a memory cell array 102 having the configuration to be described later; a row selection circuit-and-driver 103 provided with transistors (driving transistors) 103a for applying a predetermined voltage to each of word lines included in the memory cell array 102; a column selection circuit-and-driver 104 similarly provided with transistors (driving transistors) 104a for applying a predetermined voltage to each of bit lines; a write circuit 105 for performing the writing of information; a sense amplifier 106 which detects an amount of current flowing in a selected bit line and determines whether data indicates "1" or "0"; and a data input and output circuit 107 which performs input and output processing of input and output data via a terminal DQ. It is to be noted that the row selection circuit-and-driver 103 and the column selection circuit-and-driver 104 are examples of the first driving circuit and the second driving circuit according to the present invention, respectively. Furthermore, the row selection circuit-and-driver 103 and the column selection circuit-and-driver 104 make up the selection circuit according to the present invention which selects at least one variable resistance element from the memory cell array 102.

Furthermore, the nonvolatile storage device 100 includes: an address input circuit 108 which receives an address signal that is inputted from the outside; a control circuit 109 which controls operations of the memory main portion 101 based on a control signal inputted from the outside, and a substrate bias circuit 110 for forward biasing the substrate on which the transistors 103a provided in the row selection circuit-and-driver 103 and the transistors 104a provided in the column selection circuit-and-driver 104 are formed.

Figure 4:
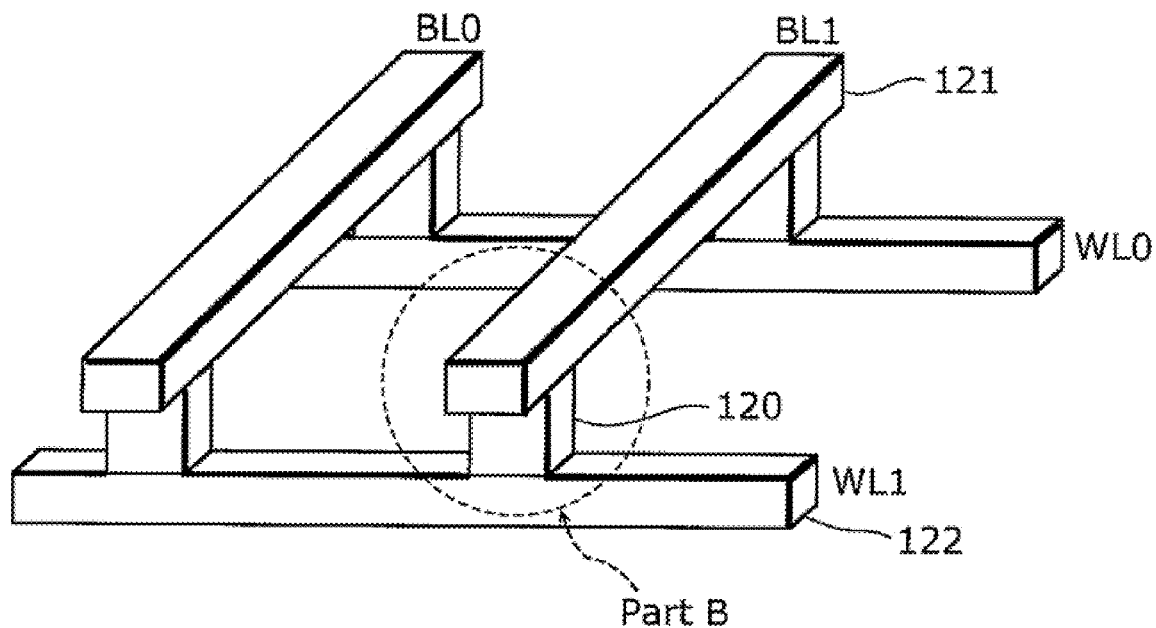
FIG. 4 is a perspective view showing a configuration of part A (configuration for four bits) in FIG. 3.

As shown in FIG. 3 and FIG. 4, the memory cell array 102 includes: word lines WL0, WL1, WL2, . . . which are an example of the first lines which are formed parallel to each other on the semiconductor substrate; and bit lines BL0, BL1, BL2, . . . which are an example of the second lines which are formed above the word lines WL0, WL1, WL2, . . . so as to be parallel to each other on a plane that is parallel to a main plane of the semiconductor substrate and to three-dimensionally cross the word lines WL0, WL1, WL2, . . . .

Furthermore, each of memory cells M111, M112, M113, M121, M122, M123, M131, M132, M133, . . . (hereinafter, referred to as memory cells M111, M112, . . . ), which are provided in a matrix to correspond a cross-point between corresponding ones of the word lines WL0, WL1, WL2, . . . and bit lines BL0, BL1, BL2, . . . , respectively.

Here, each of the memory cells M111, M112, . . . corresponds to the variable resistance element 10 described with reference to FIG. 1. However, in the present embodiment, each of the memory cells M111, M112, . . . includes a current controlling element as described later with reference to FIG. 6.

It is to be noted that each of the memory cells M111, M112, . . . in FIG. 3 are shown using the reference sign 120 in FIG. 4.

The address input circuit 108 receives address signals from an external circuit (not shown) and, based on the address signals, outputs row address signals to the row selection circuit-and-driver 103 and column address signals to the column selection circuit-and-driver 104. Here, the address signals are signals indicating an address of a specific memory cell to be selected from among the memory cells M1, M12, . . . . Moreover, the row address signals are signals indicating an address of a row which is a part of the address indicated by the address signals, and the column address signals are similarly signals indicating an address of a column which is a part of the address indicated by the address signals.

In a data write cycle, the control circuit 109 outputs, to the write circuit 105, a write command signal instructing the application of a voltage for writing, according to input data Din inputted to the data input and output circuit 107. On the other hand, in a data read cycle, the control circuit 109 outputs, to the column selection circuit-and-driver 104, a read command signal instructing a read operation.

The row selection circuit-and-driver 103 is an example of a first driving circuit provided with driving transistors which apply a predetermined voltage to each of the first lines (here, word lines). The row selection circuit-and-driver 103 receives row address signals outputted from the address input circuit 108, selects any one among the word lines WL0, WL1, WL2, . . . according to the row address signals, and applies the predetermined voltage to the selected word line.

Furthermore, the column selection circuit-and-driver 104 is an example of a second driving circuit provided with driving transistors which apply a predetermined voltage to each of the second lines (here, bit lines). The column selection circuit-and-driver 104 receives column address signals outputted from the address input circuit 108, selects any one among the bit lines BL0, BL1, BL2, . . . according to the column address signals, and applies a voltage for writing or a voltage for reading to the selected bit line.

It is to be noted that the row selection circuit-and-driver 103 and the column selection circuit-and-driver 104 make up a selection circuit which selects at least one memory cell (variable resistance element) from the memory cell array 102 according to the signals from the address input circuit 108.

The write circuit 105 is an example of a write circuit which provides an electrical signal for writing to the variable resistance element selected by the above-mentioned selection circuit. Upon receiving a write command instruction outputted from the control circuit 109, the write circuit 105 outputs, to the row selection circuit-and-driver 103, a signal instructing application of voltage to the selected word line and outputs, to the column selection circuit-and-driver 104, a signal instructing application of voltage for writing to the selected bit line.

Furthermore, the sense amplifier 106 is an example of a read circuit which, by detecting the resistance state of the variable resistance element selected by the aforementioned selection circuit, reads information ("0" or "1") stored in the variable resistance element. In the information read cycle, the sense amplifier 106 detects an amount of current flowing in the selected bit line which is to be read, and determines whether data is "1" or "0". The resultant output data DO is outputted to the external circuit via the data input and output circuit 107.

The substrate bias circuit 110 can apply substrate bias voltages to the transistors 103a provided to the row selection circuit-and-driver 103 and the transistors 104a provided to the column selection circuit-and-driver 104, by controlling the potential of the P-type well in which the row selection circuit-and-driver 103 is formed and the P-type well in which the column selection circuit-and-driver 104 is formed.

Figure 5:
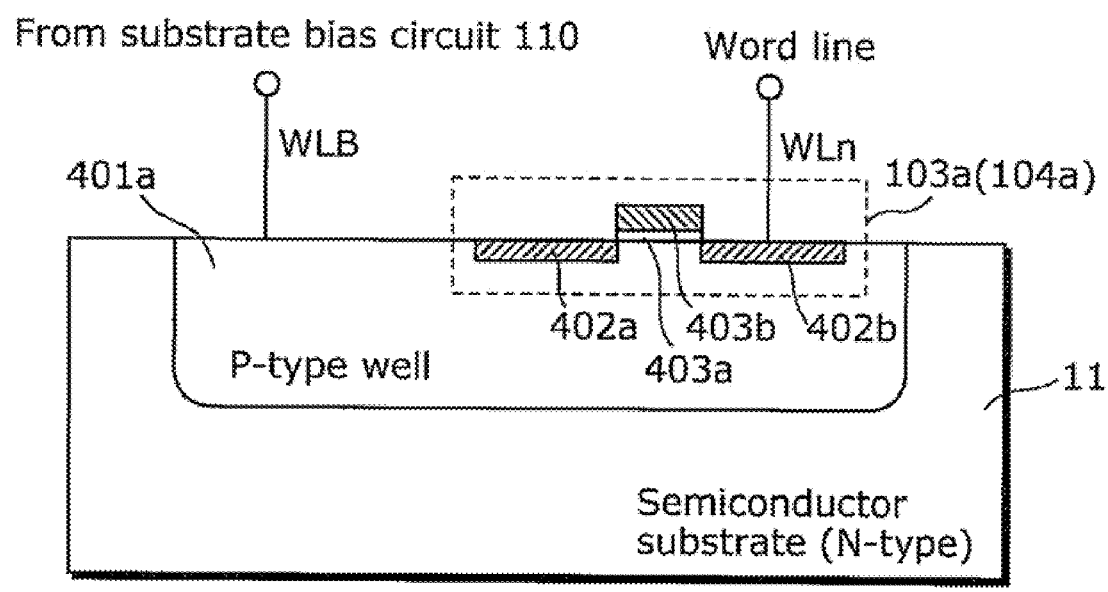
FIG. 5 is a cross-sectional view showing a configuration of a transistor provided to a row selection circuit-and-driver and a column selection circuit-and-driver.

FIG. 5 is a cross-sectional view showing a configuration of one of the transistors 103a provided to the row selection circuit-and-driver 103 (the same applies to each of the transistors 104a provided to the column selection circuit-and-driver 104). Described in more detail, the transistor 103a provided to the row selection circuit-and-driver 103 is a driving transistor (here, an NMOS transistor) which is formed in a region of a first conductivity type (here, a P-type well 401a) in the substrate 11 of N-type silicon, and includes a first diffusion region (here, a drain 402a connected to a power source) of a second conductivity type (here, N-type) having a reverse polarity to that of the first conductivity type, a gate insulator film 403a, a gate electrode 403b, and a second diffusion region (here, a source 402b connected to a word line WLn) of the second conductivity type (here, N-type). The P-type well 401a is connected to the substrate bias circuit 110 via a bias line WLB, and by way of the substrate bias circuit 110 applying voltage to the P-type well 401a via the bias line WLB, it is possible to apply a forward substrate bias voltage to the transistor 103a (a forward voltage with respect to the drain 402a and the source 402b which are N-type diffusion regions, more specifically, a forward voltage with respect to the source 402b). With this, the substrate potential of the transistor 103a is controlled.

In the same manner, the transistor 104a provided to the column selection circuit-and-driver 104 is a driving transistor (here, an NMOS transistor) which is formed in the P-type well 401a which is formed in the substrate 11 of N-type silicon and connected to the substrate bias circuit 110 via a bias line BLB, and includes a first diffusion region (here, a drain 402a connected to a constant voltage) of the second conductivity type (here, N-type) having a polarity which is reverse to the polarity of the first conductivity type, a gate insulator film 403a, a gate electrode 403b, and a second diffusion region (here, a source 402b connected to a bit line BLn) of the second conductivity type (here, N-type). By way of the substrate bias circuit 110 applying voltage to the P-type well 401a via the bias line BLB, it is possible to apply a forward substrate bias voltage to the transistor 104a (a forward voltage with respect to the drain 402a and the source 402b which are N-type diffusion regions, more specifically, a forward voltage with respect to the source 402b). With this, the substrate potential of the transistor 104a is controlled.

It is to be noted that the phrase "apply a forward substrate bias voltage" means applying a voltage to a substrate region so that (i) the substrate region (or a well) of a first conductivity type in which a transistor is formed and (ii) a diffusion region of a second conductivity type in which the source and drain (particularly, the source) of the transistor are formed, are biased in the forward direction, and specifically means applying a positive voltage to the substrate region of the first conductivity type with reference to the diffusion region of the second conductivity type in the case where the substrate region of the first conductivity type is a P-type semiconductor and the diffusion region of the second conductivity type is an N-type semiconductor and, inversely, applying a negative voltage to the substrate region of the first conductivity type with reference to the diffusion region of the second conductivity type in the case where the substrate region of the first conductivity type is the N-type semiconductor and the diffusion region of the second conductivity type is the P-type semiconductor.

(Configuration of Memory Cell)

Figure 6:
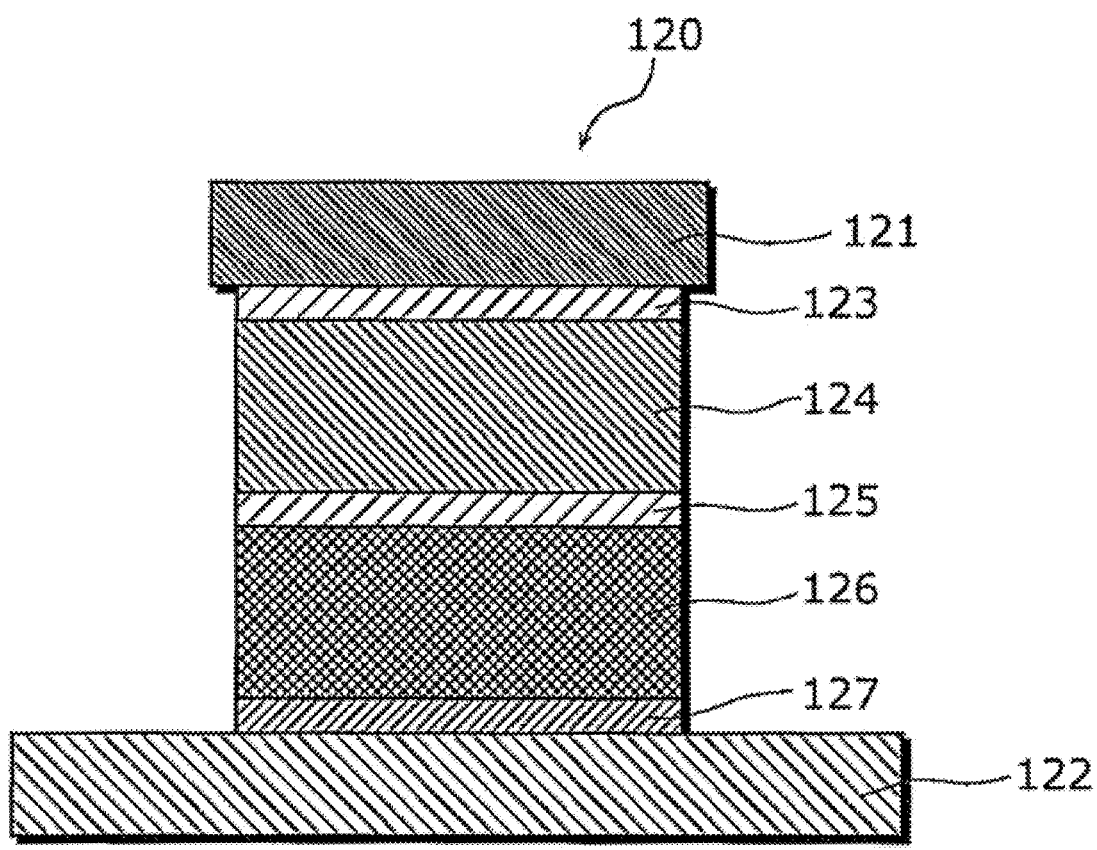
FIG. 6 is a cross-sectional view showing a configuration of a memory cell included in the nonvolatile storage device according to Embodiment 1 of the present invention.

FIG. 6 is a cross-sectional view showing a configuration of a memory cell 120 included in the nonvolatile storage device according to Embodiment 1 of the present invention. It is to be noted that FIG. 6 shows the configuration in part B in FIG. 4.

As shown in FIG. 6, each of the memory cells 120 included in the nonvolatile storage device according to the present embodiment is a one-bit memory element to which a variable resistance element and a current controlling element are serially-connected, and is interposed between a lower wire 122 (corresponding to the word line WL1 in FIG. 4) which is a copper wire, an upper wire 121 (corresponding to the bit line BL1 in FIG. 4) which is similarly a copper wire. The memory cell 120 is formed by sequentially stacking a lower electrode 127, a current controlling layer 126, an inner electrode 125, a variable resistance layer 124, and an upper electrode 123.

Here, the inner electrode 125, the variable resistance layer 124, and the upper electrode 123 correspond respectively to the lower electrode 13, the variable resistance layer 14, and the upper electrode 15 in the variable resistance element 10 shown in FIG. 1.

The current controlling element (here, a bi-directional diode) is configured by placing the current controlling layer 126 between the lower electrode 127 and the inner electrode 125 which are arranged one above the other, and is a load element that is serially-connected to the variable resistance layer 124 via the inner electrode 125. The current controlling element is an element typified by a diode, and shows nonlinear current characteristics with respect to voltage. Furthermore, the current controlling element has bi-directional current characteristics with respect to voltage, and is configured to be conductive at a predetermined threshold voltage Vf (for example +1 V or higher or −1 V or lower with reference to one of the electrodes). Specifically, a Metal Semiconductor Metal (MSM) diode, a Metal Insulator Metal (MIM) diode a varistor, and the like, can be used.

(Transistor Size)

As described above, in the present embodiment, forward biasing is performed on the region of the substrate 11 (P-well 401a) in which the transistors 103a and 104b provided in the row selection circuit-and-driver 103 and the column selection circuit-and-driver 104, respectively. This makes it possible to reduce the on-resistance of the transistors and increase the voltage applied to the variable resistance element. Consequently, it is possible to reliably perform resistance changing. With this configuration, it is possible to realize an excellent storage device without increasing the size of the transistors of the row selection circuit-and-driver 103 and the column selection circuit-and-driver 104. Focusing on the size of these transistors, the following describes the characteristics of the nonvolatile storage device according to the present embodiment.

Figure 7:
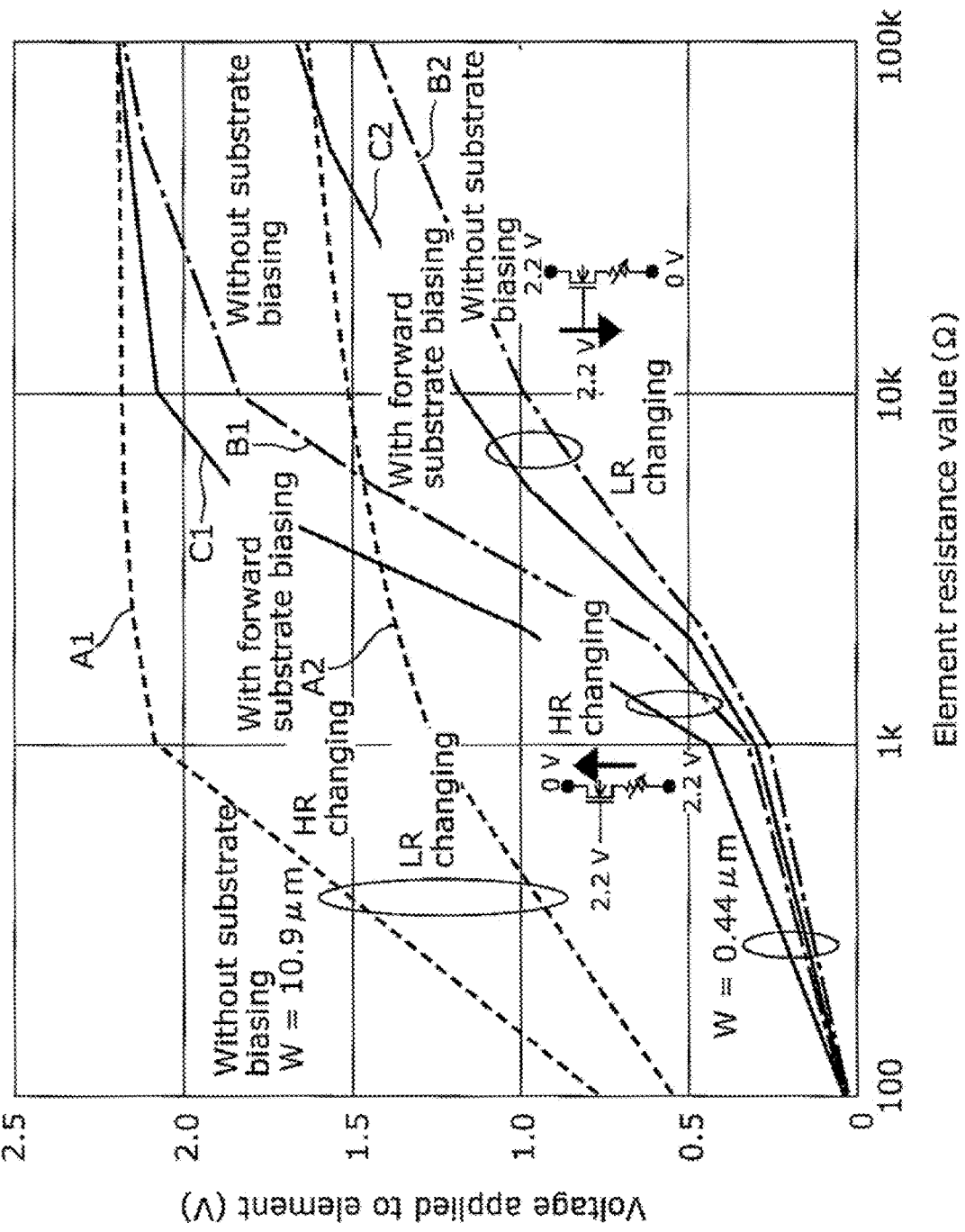
FIG. 7 is a graph showing the relationship between the voltage effectively applied to a variable resistance-element interposed between corresponding ones of the word lines and the bit lines and the resistance value of the variable resistance element 10, when a predetermined voltage is applied between the word lines and the bit lines.

FIG. 7 is a graph showing the relationship between the (i) voltage (hereafter referred to as voltage applied to the variable resistance element) effectively applied to a variable resistance element 10 interposed between corresponding ones of the word lines and the bit lines and the (ii) resistance value (hereafter referred to as the resistance value of the variable resistance element) of the variable resistance element 10, when a predetermined voltage is applied between the word lines and the bit lines.

It assumed that the current controlling element (selection diode) which selects the respective variable resistance elements 10 is in the on-state (conductive state), and the resistance of the current controlling element is extremely low.

In FIG. 7, in the case where a width W of the transistors 103a and 104a provided to the row selection circuit-and-driver 103 which drives the word lines and the column selection circuit-and-driver 104 which drives the bit lines, respectively, is 10.9 μm, the relationship between the voltage applied to the variable resistance element and the resistance value of the variable resistance element when the resistance state of the variable resistance element 10 is changed from the low resistance state to the high resistance state (when applying a positive voltage) is represented by a graph A1, and similarly the relationship between the voltage applied to the variable resistance element and the resistance value of the variable resistance element when the resistance state of the variable resistance element 10 is changed from the high resistance state to the low resistance state (when applying a negative voltage) is represented by a graph A2. It is to be noted that, here, the positive voltage is a voltage to be applied to the upper electrode 15 with reference to the lower electrode 13, and the negative voltage is a voltage to be applied to the lower electrode 13 with reference to the upper electrode 15.

It is to be noted that the substrate biasing as described in the present embodiment is not performed in graphs A1 and A2.

Furthermore, in the case where the width W of the transistors 103a and 104a is 0.44 μm, the relationship between the voltage applied to the variable resistance element and the resistance value of the variable resistance element when the resistance state of the variable resistance element 10 is changed from the low resistance state to the high-resistance state (when the positive voltage is applied) is represented by a graph B1, and similarly the relationship between the voltage applied to the variable resistance element and the resistance value of the variable resistance element when the resistance state of the variable resistance element 10 is changed from the high resistance state to the low resistance state (when the negative voltage is applied) is represented by a graph B2.

It is to be noted that the substrate biasing as described in the present embodiment is not performed in graphs B1 and B2.

In addition, in the case where the width W of the transistors 103a and 104a is the same as in the graphs B1 and B2, but the substrate biasing is performed using the same bias voltage as in the above-described present embodiment, the relationship between the voltage applied to the variable resistance element and the resistance value of the variable resistance element when the resistance state of the variable resistance element 10 is changed from the low resistance state to the high resistance state (when the positive voltage is applied) is represented by a graph C1, and similarly the relationship between the voltage applied to the variable resistance element and the resistance value of the variable resistance element when the resistance state of the variable resistance element 10 is changed from the high resistance state to the low resistance state (when the negative voltage is applied) is represented by a graph C2.

In FIG. 7 which shows the result of the simulation performed under the above-described conditions, a comparison of the graphs A1 and B1 shows that even when the same voltage is applied to the memory cell, the voltage applied to the variable resistance element is lower in the case where the size of the transistors 103a and 104a is small. This also holds true with a comparison of the graphs A2 and B2. This is because the resistance value (on-resistance) in the case where the transistors 103a and 104a are in the on-state decreases in inverse-proportion to the gate width W of the transistors 103a and 104a and the on-resistance of the transistors 103a and 104a increases in the case where the gate width W is small, which results in the increase in the voltage applied to the transistors 103a and 104a and the decrease in the voltage allocated to the variable resistance element 10.

Furthermore, a comparison of the graphs B1 and C1 shows that even when the same voltage is applied to the transistors 103a and 104a having the same length of one side, the voltage applied to the variable resistance element can be increased by performing the substrate biasing described in the present embodiment. This also holds true with a comparison of the graphs B2 and C2. This is because application of a forward substrate bias voltage lowers the threshold voltage and reduces the on-resistance, and thus the voltage applied to the transistors 103a and 104a is reduced and the voltage allotted to the variable resistance element 10 is increased.

As stated above, performing substrate biasing described in the present embodiment allows the voltage applied to the variable resistance element to be increased without increasing the size of the transistors 103a and 104a and, as a result, the resistance value of the variable resistance element 10 can be reliably changed. Therefore, stable operation of the nonvolatile storage device can be realized without increasing the size of the row selection circuit-and-driver and the column selection circuit-and-driver which are provided with the transistors 103a and 104a, respectively.

In particular, when changing the resistance of the variable resistance element 10 to high resistance state (causing transition from the low resistance state to the high resistance state), the variable resistance element 10 is in the low resistance state immediately prior to the changing, and thus the voltage allocated to the variable resistance element 10 itself is reduced due to the distribution relationship between the resistance value of the variable resistance element 10 and the resistance values of the transistors 103a and 104a. Therefore, the substrate biasing in the present embodiment is more effective, as a method for further reliably applying voltage to the variable resistance element 10, when changing the resistance of the variable resistance element 10 to high resistance state than when changing the resistance to low resistance state (causing transition from the high resistance state to the low resistance state).

It is to be noted that increasing the substrate bias voltage decreases the threshold voltage of the transistors 103a and 104a, but excessively increasing the substrate bias voltage turns on a PN junction diode formed between the P-type well and the N-type diffusion region of the transistors 103a and 104a, and current flows from the P-type well 401a to the word line and the bit line. It is necessary to set the threshold voltage to 0.7 V or less because, normally, a diffusion potential of the PN diode comprising silicon is approximately 0.7 V. More specifically, 0.5 V or less is preferable in order to more reliably prevent a phenomenon in which the current flows from the P-type well to the variable resistance element.

Although the above has been described in the case where the transistors 103a and 104a are NMOS transistors, the present invention may of course use PMOS transistors. In such a case, conductivity types of the well and the diffusion regions of the transistors will have a polarity which is reverse to that in the case of the NMOS transistor, and the polarity of the substrate bias voltage applied to the well also becomes a reverse polarity.

(Operations of Nonvolatile Storage Device)

Next, example operations of the nonvolatile storage apparatus according to the present embodiment in a write cycle when information is written and in a read cycle when information is read shall be described with reference to the timing chart shown in FIG. 8.

Figure 8:
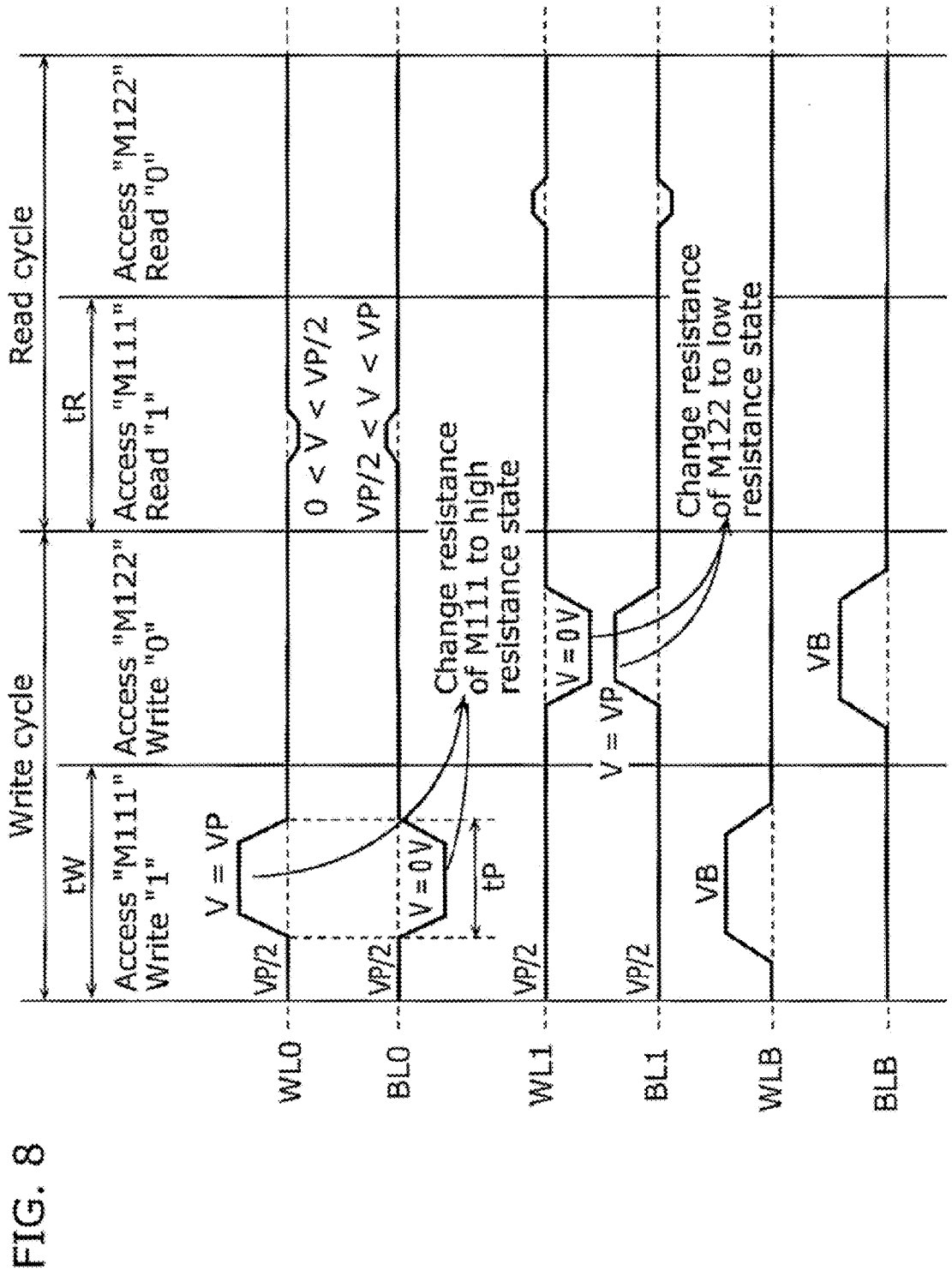
FIG. 8 is a timing chart showing example operations of the nonvolatile storage device according to Embodiment 1 of the present invention.

FIG. 8 is a timing chart showing example operations of the nonvolatile storage device according to Embodiment 1 of the present invention. It is to be noted that, here, the example operations are shown for when information "1" is assigned to the case where the variable resistance layer is in a high resistance state and information "0" is assigned to a case where the variable resistance layer is in a low resistance state. Furthermore, for the sake of convenience of description, only the cases for writing and reading information with regard to the memory cells M111 and M122 are shown.

VP in FIG. 8 denotes a pulse voltage necessary in changing the resistance of a memory cell including a variable resistance element and a current controlling element. Here, it is preferable that the following relationship is satisfied: VP/2≦Vf (threshold voltage of the current controlling element). This is because it allows suppression of leakage current which flows through a non-selected memory cell. As a result, it is possible to suppress excess current supplied to a memory cell for which writing of information is not necessary, and enables further reduction of current consumption. In addition, there is also the advantage that unintended soft-writing (generally called disturb) into a non-selected memory cell is suppressed.

Furthermore, in FIG. 8, a write cycle time, which is the time needed for one write cycle, is denoted as tW, and a read cycle time, which is the time needed for one read cycle, is denoted as tR.

In a write cycle for the memory cell M111, a bias voltage VB is supplied by the substrate bias circuit 110 to the bias line WLB based on the signal from the write circuit 105. As a result, the bias voltage VB is applied to the substrate on which the transistor 103a provided to the row selection circuit-and-driver 103 is formed. Furthermore, a pulse voltage VP of a pulse width tP is applied by the row selection circuit-and-driver 103 to the word line WL0 and, in accordance with the timing of such application, a voltage of 0 V is similarly applied by the column selection circuit-and-driver 104 to the bit line BL0. With this, the voltage for writing in the case of writing the information "1" into the memory cell M111 is applied, and as a result, the resistance of the variable resistance layer of the memory cell 111 changes to a high resistance state. Specifically, the information "1" is written into the memory cell M111.

In this manner, by forward biasing the substrate on which the transistor 103a is formed, through the application of the bias voltage VB by the substrate bias circuit 110, the threshold voltage of the transistor 103a can be lowered. With this, the voltage applied to the memory cell M111 can be increased, and as a result, the resistance of the variable resistance layer of the memory cell 111 can be reliably changed to high resistance state.

Next, in a write cycle for the memory cell M122, the bias voltage VB is supplied by the substrate bias circuit 110 to the bias line BLB based on the signal from the write circuit 105. As a result, the bias voltage VB is applied to the substrate on which the transistor 104a provided to the column selection circuit-and-driver 104 is formed. Furthermore, a voltage of 0 V is applied by the row selection circuit-and-driver 103 to the word line WL1 and, in accordance with the timing of such application, the pulse voltage VP is similarly applied by the column selection circuit-and-driver 104 to the bit line BL1. With this, the voltage for writing in the case of writing the information "0" into the memory cell M122 is applied, and as a result, the resistance of the variable resistance layer of the memory cell 122 changes to low resistance state. Specifically, the information "0" is written into the memory cell M122.

In this case too, by forward biasing the substrate on which the transistor 104a is formed, through the application of the bias voltage VB by the substrate bias circuit 110, the threshold voltage of the transistor 104a can be lowered. With this, the voltage applied to the memory cell M122 can be increased, and as a result, the resistance of the variable resistance layer of the memory cell 122 can be reliably changed to low resistance state.

In this manner, when an electrical signal for writing is provided by the write circuit 105 to the variable resistance element selected by the above-described selection circuit, the substrate bias circuit 110 applies a bias voltage to the P-type well 401a in the substrate 11 on which at least one of the transistors 103a and 104a provided to the row selection circuit-and-driver 103 and the column selection circuit-and-driver 104, respectively, is formed. Here, the bias voltage is applied in a forward direction with respect to the source and the drain of the transistor.

In the read cycle for the memory M111, the row selection circuit-and-driver 103 applies, to the word line WL0, a voltage which is a pulse voltage having a smaller amplitude than the pulse at the time of writing and a value that is larger than 0 V and smaller than VP/2. Furthermore, in accordance with the timing of such application, the column selection circuit-and-driver 104 applies, to the bit line BL0, a voltage which is a pulse voltage having a smaller amplitude than the pulse at the time of writing and a value that is larger than VP/2 and smaller than VP. With this, a current corresponding to the resistance value of the variable resistance layer 124 of the memory cell M111 that has been changed to high resistance state is outputted, and through the detection of such output current value by the sense amplifier 106, the information "1" is read.

Next, in the read cycle for the memory M122, voltages that are the same as those in the preceding read cycle for the memory cell 111 are applied to the word line WL1 and the bit line BL1. With this, a current corresponding to the resistance value of the variable resistance layer 124 of the memory cell M122 that has been changed to low resistance state is outputted, and through the detection of such output current value by the sense amplifier 106, the information "0" is read.

Figure 9:
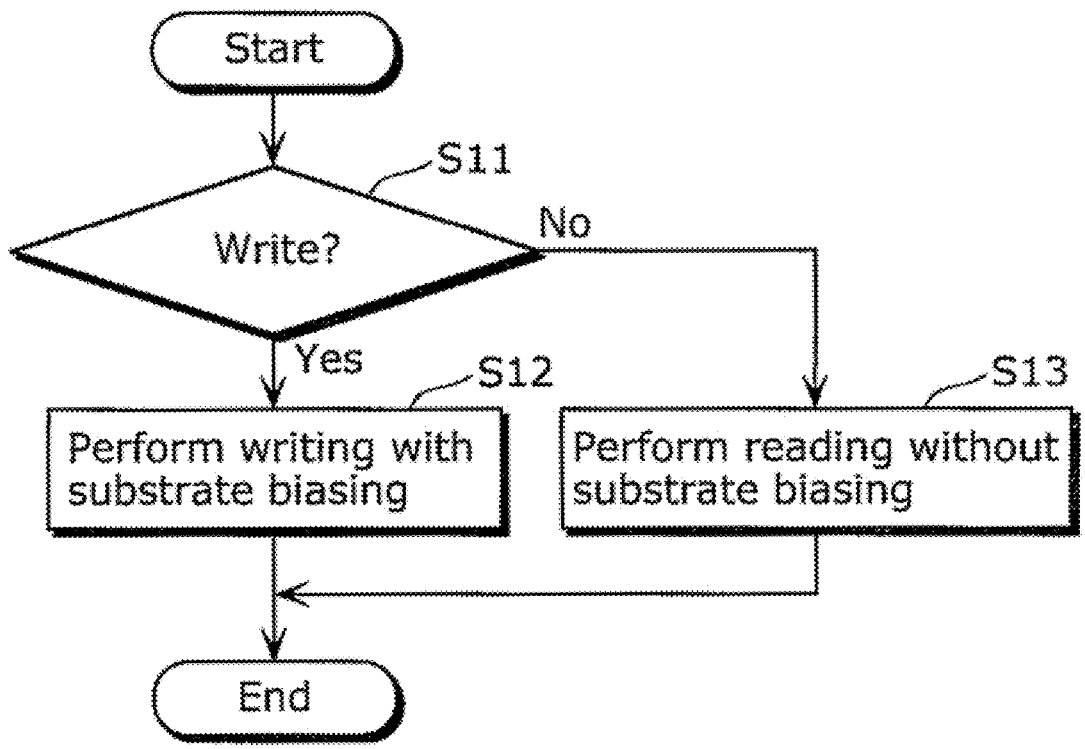
FIG. 9 is a flowchart showing a procedure of a writing method performed by the nonvolatile storage device according to Embodiment 1 of the present embodiment.

FIG. 9 is a flowchart showing a procedure of substrate biasing which is a characteristic operation of the nonvolatile storage device 100 according to the present embodiment. Shown here is the procedure of a method for writing performed by the nonvolatile storage device according to the present invention.

The control circuit 109 determines whether to perform a write cycle or a read cycle on a memory cell identified by the address input circuit 108 (S11). When a write cycle is to be performed (Yes in S11), the control unit 109 causes a write cycle with substrate biasing to be performed on at least one memory cell (variable resistance element) selected by the selection circuit (the row selection circuit-and-driver 103 and the column selection circuit-and-driver 104), by instructing the substrate bias circuit 110 and the write cycle 105 accordingly (S12). On the other hand, when a read cycle is to be performed (No in S11), the control unit 109 causes a read cycle without substrate biasing to be performed on at least one memory cell (variable resistance element) selected by the selection circuit (the row selection circuit-and-driver 103 and the column selection circuit-and-driver 104), by instructing the substrate bias circuit 110 and the sense amplifier 106 accordingly (S13).

With this, when a voltage pulse for writing is applied to the variable resistance element included in the memory cell selected by the selection circuit, a forward bias voltage (for example, 0.3 V) is applied to the substrate (in the present embodiment, the P-type well 401a) on which either the transistor 103a provided to the row selection circuit-and-driver 103 and the transistor 104a provided to the column selection circuit-and-driver 104 is formed, depending on the information ("1" or "0") written into the variable resistance element. With such an application of a forward bias voltage, the on-resistance of the transistor is reduced and, as a result, a higher voltage is applied to the variable resistance element.

In this manner, according to the present embodiment, in the write cycle to the memory cell (variable resistance element), a bias voltage is applied in the forward direction to the semiconductor substrate (well) on which the transistor included in the selection circuit which selects the memory cell is formed, and thus a higher voltage is applied to the variable resistance element. As a result, more stable writing is performed, and it is possible to cause the nonvolatile storage device to operate more stably without increasing the gate width of the transistor.

(Embodiment 2)

Next, a nonvolatile storage device according to Embodiment 2 of the present invention shall be described.

In a nonvolatile storage device using variable resistance elements, in the case where a resistance value of a variable resistance element is an initial resistance value (resistance value at a time when a voltage is to be applied for the first time after the variable resistance element is manufactured, that is, resistance value in the case where a voltage pulse has not yet been applied since the manufacture of the variable resistance element), there are times when a process for applying a higher voltage than a voltage applied during normal writing (hereinafter, referred to as initialization process) is performed so that the resistance value of the variable resistance element can be changed repeatedly in a stable manner. The nonvolatile storage device according to Embodiment 2 achieves the initialization process by forward biasing the substrate on which the transistors provided to the row selection circuit-and-driver 103 and the column selection circuit-and-driver 104 are formed, through the application of a bias voltage by the substrate bias circuit.

It is to be noted that the configuration of the nonvolatile storage device according to Embodiment 2 is the same as in the case of Embodiment 1, and thus description of the basic configuration shall be omitted. Unlike the nonvolatile storage device according to Embodiment 1 which performs substrate biasing in the write cycle, the nonvolatile storage device according to the present embodiment performs substrate biasing only during the initialization process. Hereinafter, description shall be made with reference to FIG. 3 as needed.

As stated above, the nonvolatile storage device according to Embodiment 2 executes the substrate biasing performed by the substrate bias circuit 110 in the initialization process. Specifically, the write process in the previously described Embodiment 1 is executed in the initialization process.

Figure 10:
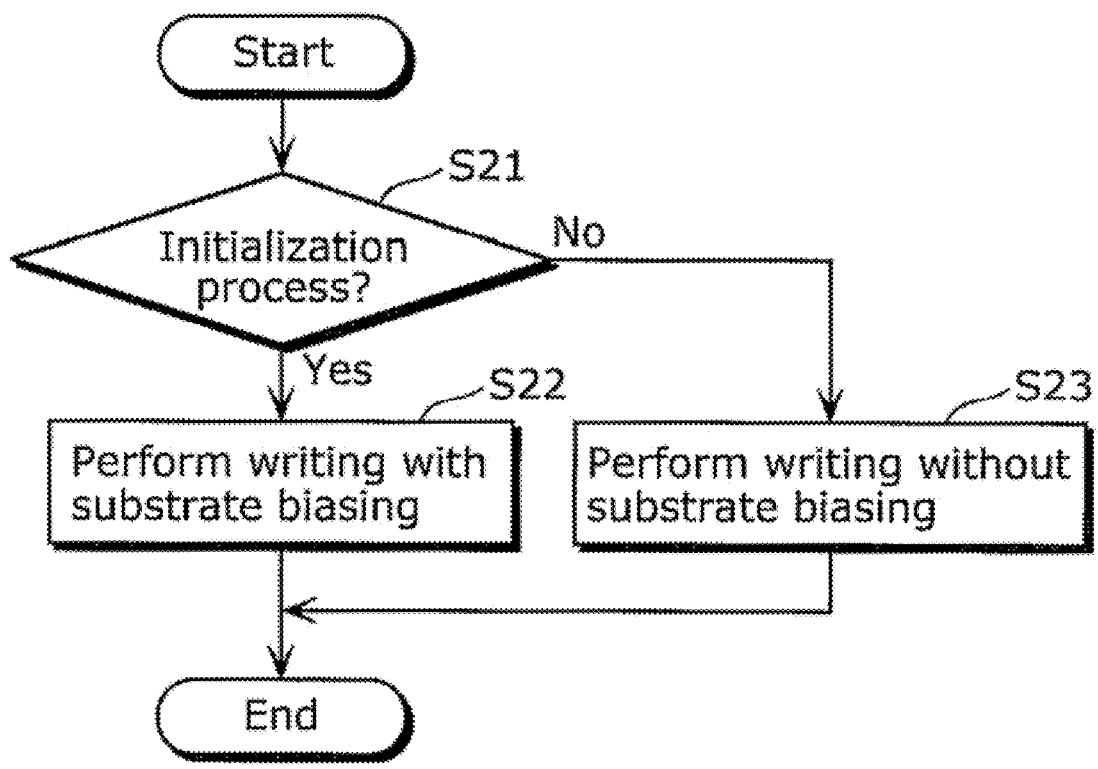
FIG. 10 is a flowchart showing a procedure of a writing method performed by a nonvolatile storage device according to Embodiment 2 of the present embodiment.

FIG. 10 is a flowchart showing a procedure of substrate biasing which is a characteristic operation of the nonvolatile storage device according to the present embodiment. Shown here is the procedure of a method for writing performed by the nonvolatile storage device according to the present invention.

The control circuit 109 determines whether or not the writing is a first writing after manufacturing (that is, an initialization process) for the memory cell identified by the address input circuit 108 (S21). Upon determining that the writing is an initialization process (Yes in S21), the control unit 109 causes a write cycle with substrate biasing to be performed on at least one memory cell (variable resistance element) selected by the selection circuit (the row selection circuit-and-driver 103 and the column selection circuit-and-driver 104), by instructing the substrate bias circuit 110 and the write cycle 105 accordingly (S22). On the other hand, upon determining that the writing is not an initialization process (a second or more subsequent writing) (No in S21), the control unit 109 causes a write cycle without substrate biasing to be performed on at least one memory cell (variable resistance element) selected by the selection circuit (the row selection circuit-and-driver 103 and the column selection circuit-and-driver 104), by instructing the substrate bias circuit 110 and the write cycle 105 accordingly (S23). With this, it is possible to increase the voltage applied to an element in the initialization process more than the voltage applied to an element in normal writing, and as a result, stabilization of subsequent resistance change can be achieved.

Figure 11:
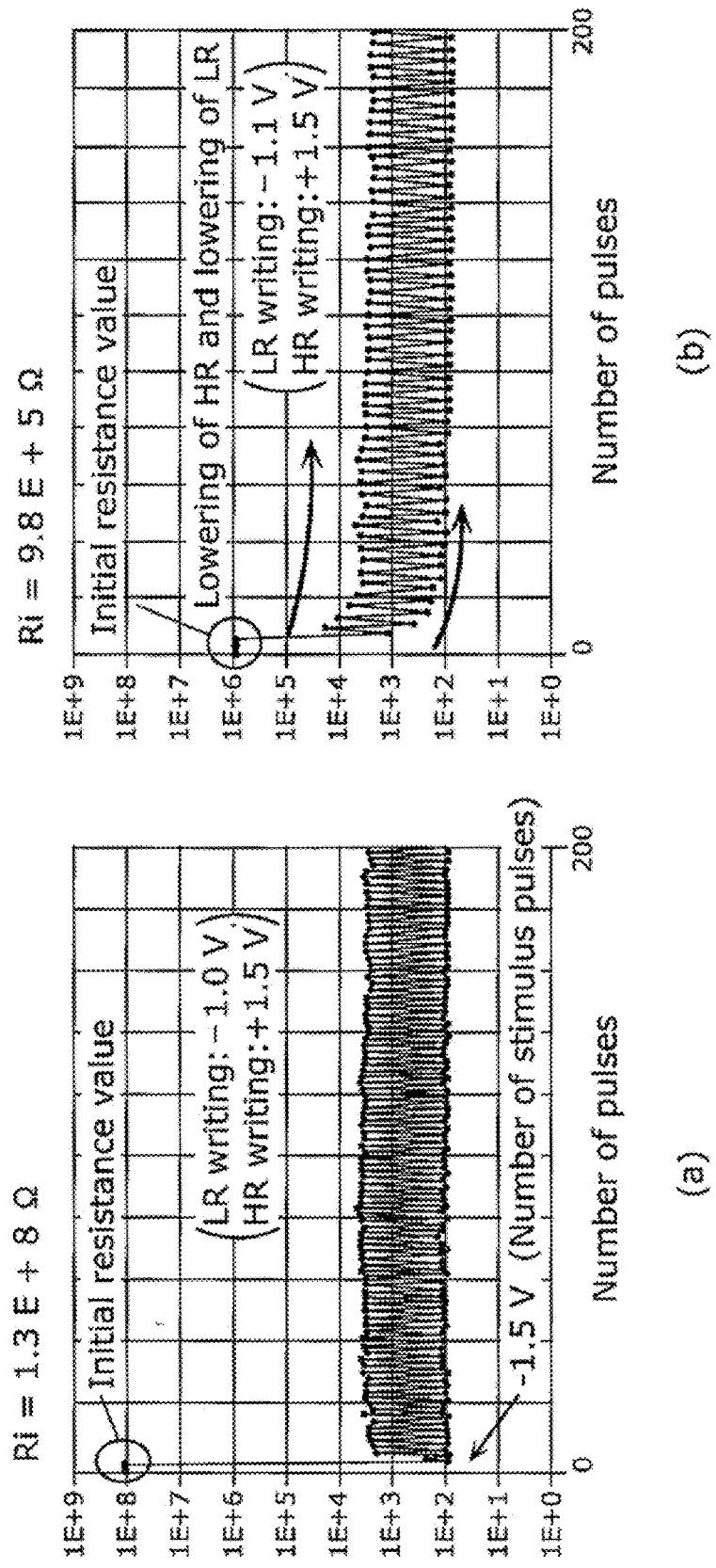
FIGS. 11 (a) and (b) are graph showing a change of a resistance state of a variable resistance element included in the nonvolatile storage device.

FIGS. 11 (a) and (b) are graphs each showing a change of a resistance state of a variable resistance element included in a nonvolatile storage device. More specifically, FIG. 11 (a) shows a change of a resistance state of the variable resistance element included in the nonvolatile storage device according to Embodiment 2 of the present invention, whereas FIG. 11 (b) shows a resistance change of a variable resistance element in the case where the initialization process is not performed.

In FIG. 11 (a), a voltage of −1.5 V is applied, as a stimulus pulse, to the variable resistance element only in the initialization process, and +1.5 V as a voltage for resistance change to high resistance state and −1.0 V as a voltage for resistance change to low resistance state are alternately and repeatedly applied in subsequent write processes. As with the timing of the write cycle shown in FIG. 8, the −1.5 V voltage applied as the stimulus pulse is obtained by performing forward substrate biasing through the application of a bias voltage by the substrate bias circuit 110.

On the other hand, in FIG. 11 (b), the initialization process is not performed, and +1.5 V as the voltage for resistance change to high resistance state and −1.1 V as the voltage for resistance change to low resistance state are alternately and repeatedly applied to the variable resistance element.

In the case where, in the initialization process, the stimulus pulse is applied to the variable resistance element under forward substrate biasing by the substrate bias circuit 110, the resistance value of the variable resistance element is stable in either a high resistance state or a low resistance state from the time of the initialization process as shown in FIG. 11 (a). In contrast, in the case where the initialization process in which such a stimulus pulse is applied is not performed, it is necessary to repeatedly apply a voltage pulse 20 to 30 times until the resistance value is stabilized in either the high resistance state or the low resistance state as shown in FIG. 11 (b).

In this manner, since a stimulus pulse having a larger absolute value than that during normal writing is applied to the memory cell during the initialization process, it becomes possible to immediately stabilize the resistance changing of the variable resistance element by performing forward substrate biasing using the substrate bias circuit 110. With this, it is possible to realize the nonvolatile storage device which can operate stably.

It is to be noted that although the nonvolatile storage device according to the present embodiment performs substrate biasing only in the initialization process, the substrate biasing may also be performed in the normal write cycle as with Embodiment 1, in addition to the initialization process.

(Embodiment 3)

Next, a nonvolatile storage device according to Embodiment 3 of the present invention shall be described.

The nonvolatile storage device according to Embodiment 3 performs forward substrate biasing through the application of a bias voltage by the substrate bias circuit, when changing the resistance state of a resistance variable element from low resistance state to high resistance state.

It is to be noted that the basic configuration of the nonvolatile storage device according to Embodiment 3 is the same as in the case of Embodiment 1, and thus description thereof shall be omitted Unlike the nonvolatile storage device according to Embodiment 1 which performs substrate biasing in both the resistance change to high resistance state (writing "1") and the resistance change to low resistance state (writing "0") of the variable resistance element in the write cycle, the nonvolatile storage device according to present embodiment performs substrate biasing only in the case of resistance change to high resistance state. Hereinafter, description shall be made with reference to FIG. 3 as needed.

Figure 12:
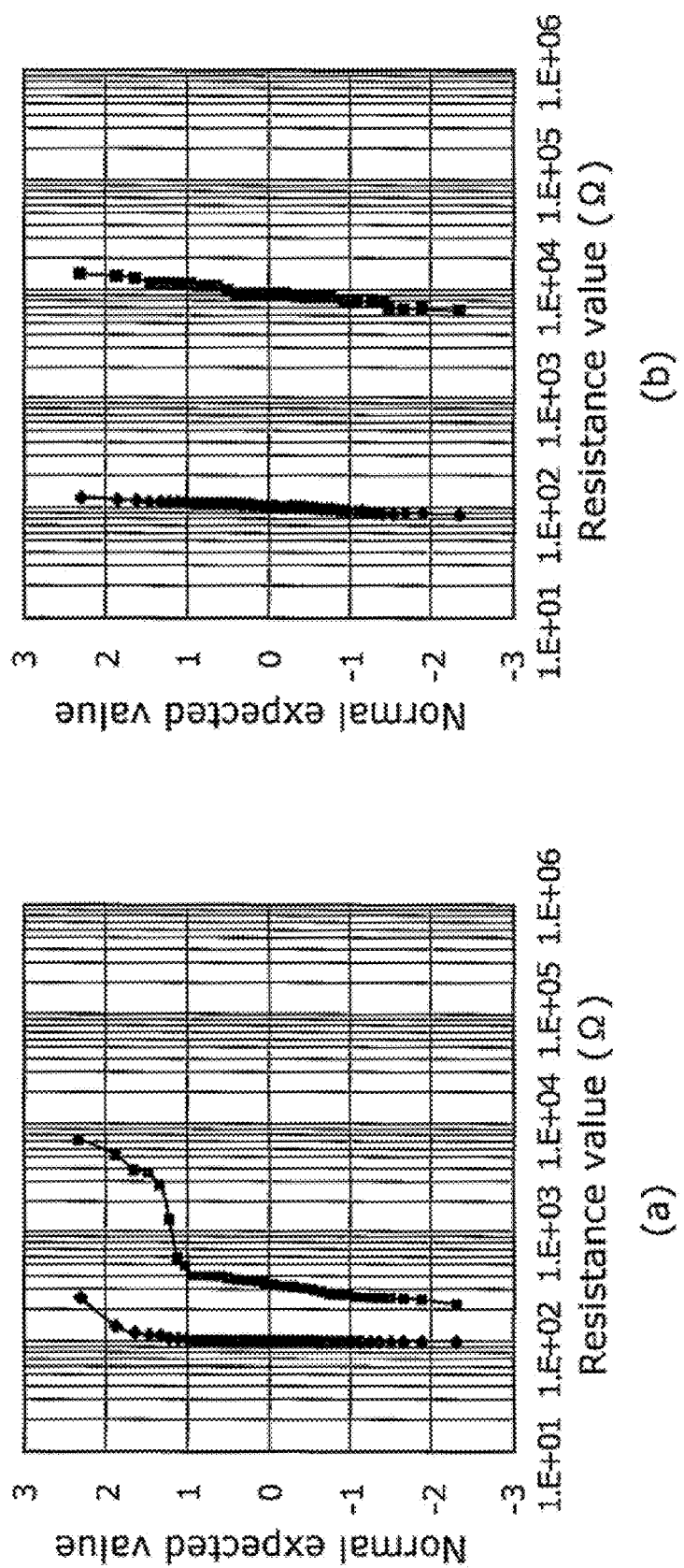
FIGS. 12 (a) and (b) are graphs showing a resistance value distribution in the case where a variable resistance element is rewritten 100 times.

FIGS. 12 (*a*) and (*b*) are graphs each showing distributions of resistance values in the case where a variable resistance element is rewritten 100 times. FIG. 12 (*a*) shows the distribution of resistance values in the case where +1.4 V and −1.3 V are applied as a voltage for resistance change to high resistance state and a voltage for resistance change to low resistance state, respectively, and FIG. 12 (*b*) shows the distribution of resistance values in the case where +1.8 V and −1.3 V are applied as the voltage for resistance change to high resistance state and the voltage for resistance change to low resistance state, respectively. In other words, in FIGS. 12 (*a*) and (*b*), the voltage for resistance change to low resistance state is common for both, and only the voltage for resistance change to high resistance state is different, with the voltage in FIG. 12 (*b*) being higher than the voltage in FIG. 12 (*a*).

As shown in FIGS. 12 (*a*) and (*b*), the resistance values of the variable resistance element in the low resistance state are comparatively stable in either of the cases. However, the resistance values in the high resistance state differ between FIGS. 12 (*a*) and (*b*). While the resistance values vary and are unstable in FIG. 12 (*a*), the resistance values shown in FIG. 12 (*b*) are stable in the same manner as in the case of the low resistance state. From this, it is clear that a higher value of the voltage for resistance change to high resistance state/voltage for resistance change to low resistance state (ratio of the absolute value of the voltage for resistance change to high resistance state to the absolute value of the voltage for resistance change to low resistance state) enables stabilization of the resistance value in the high resistance state.

Only when applying the voltage for resistance change to high resistance state does the nonvolatile storage device according to the present embodiment perform forward substrate biasing through the application of a bias voltage by the substrate bias circuit 110 to increase the value of the voltage for resistance change to high resistance state/voltage for resistance change to low resistance state and thus stabilize the resistance value in the high resistance state.

Figure 13:
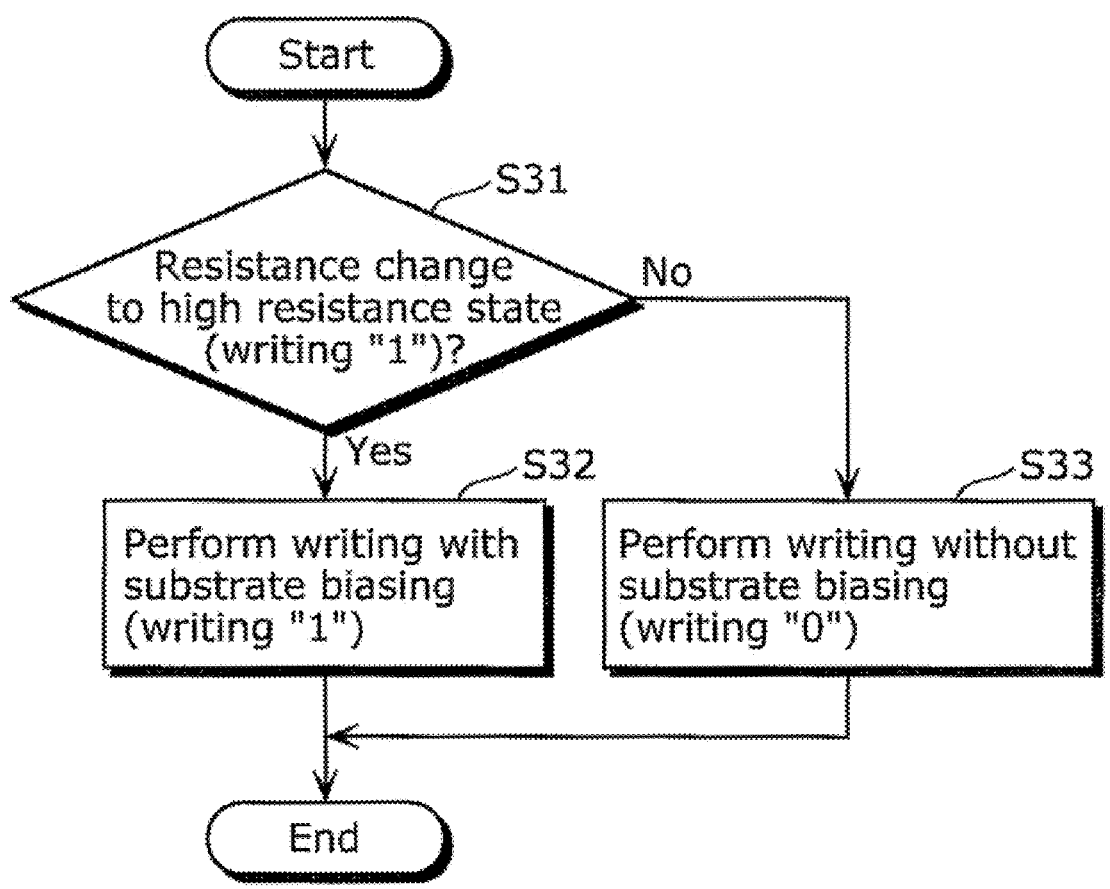
FIG. 13 is a flowchart showing a procedure of a writing method performed by a nonvolatile storage device according to Embodiment 3 of the present embodiment.

FIG. 13 is a flowchart showing a procedure of substrate biasing to which is a characteristic operation of the nonvolatile storage device according to the present embodiment. Shown here is the procedure of a method for writing performed by the nonvolatile storage device according to the present invention.

The control circuit 109 determines whether to perform resistance change to high resistance state (writing "1") or resistance change to low resistance state (writing "0") on a memory cell identified by the address input circuit 108 (S31). When resistance change to high resistance state is to be performed (Yes in S31), the control unit 109 causes a write cycle with substrate biasing of the transistor 103*a* provided to the row selection circuit-and-driver 103 to be performed on at least one memory cell (variable resistance element) selected by the selection circuit (the row selection circuit-and-driver 103 and the column selection circuit-and-driver 104), by instructing the substrate bias circuit 110 and the write cycle 105 accordingly (S32). On the other hand, when resistance change to low resistance state is to be performed (No in S31), the control unit 109 causes a write cycle without substrate biasing to be performed on at least one memory cell (variable resistance element) selected by the selection circuit (the row selection circuit-and-driver 103 and the column selection circuit-and-driver 104), by instructing the substrate bias circuit 110 and the write cycle 105 accordingly (S33).

Figure 14:
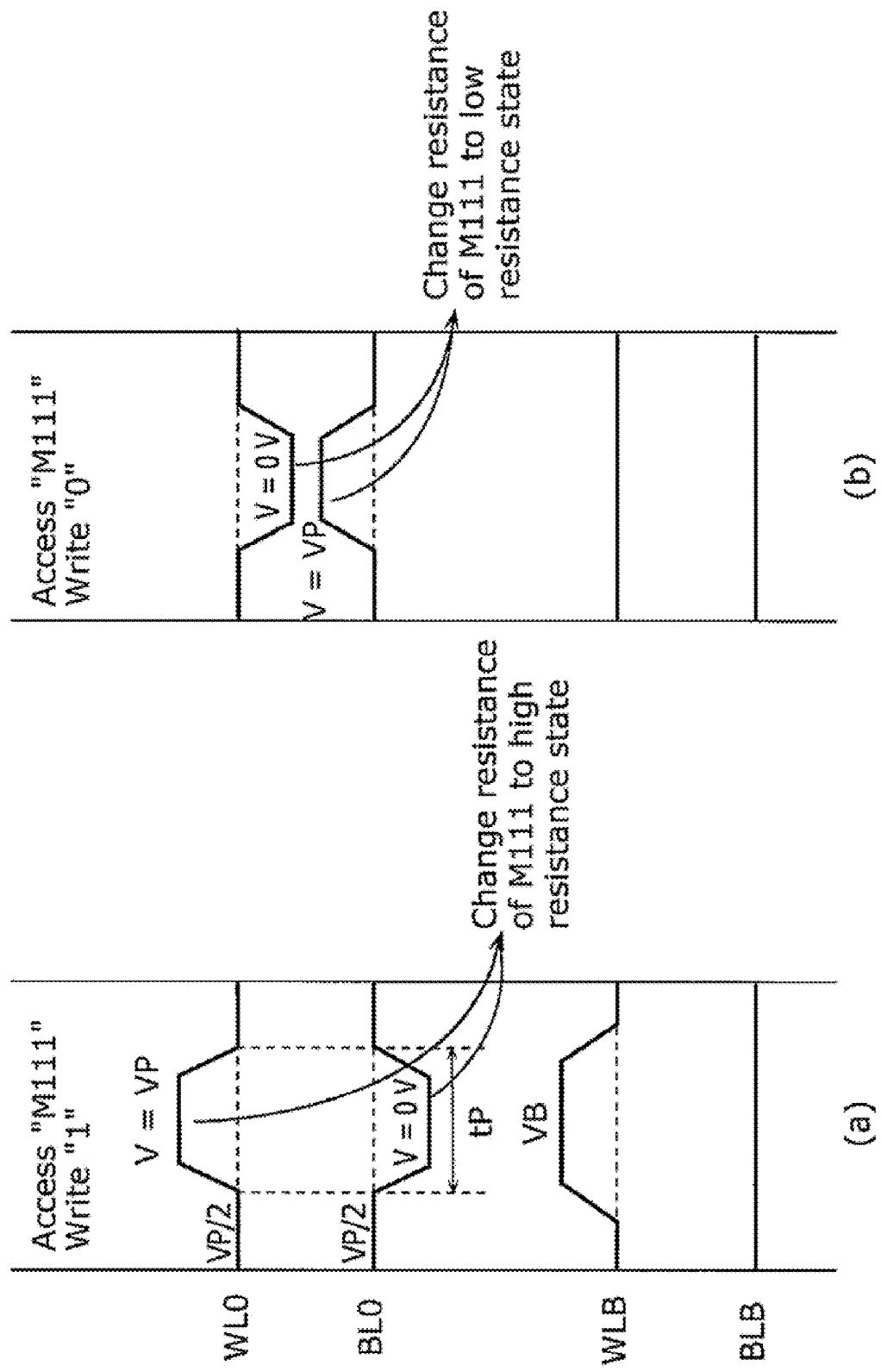
FIGS. 14 (a) and (b) are timing charts showing example operations of the nonvolatile storage device according to Embodiment 3 of the present invention.

FIG. 14 is a timing chart showing example operations of the nonvolatile storage device according to Embodiment 3 of the present invention. Described here are the example operations in the case where the information "1" (in the case of resistance change to high resistance state) or the information "0" (in the case of resistance change to low resistance state) is written into the memory cell M111.

As shown in FIG. 14 (*a*), operation in the case of writing the information "1" (the case of resistance change to high resistance state) is the same as the operation in the case in Embodiment 1 described previously with reference to FIG. 8. On the other hand, as shown in FIG. 14 (*b*), unlike in FIG. 8, in the case of writing the information "0" (the case of resistance change to low resistance state), application of the bias voltage VB by the substrate bias circuit 110 is not performed. In other words, in the case of resistance change to low resistance state, the same operation as the conventional operation is performed.

As described above, by performing the forward substrate biasing by the substrate bias circuit 110 only in the case of resistance change to low resistance state and not in the case of resistance change to high resistance state, the ratio of the voltage for resistance change to high resistance state/voltage for resistance change to low resistance state can be increased in comparison to when such a substrate biasing is not performed at all. With this, it is possible to stabilize the resistance value in the high resistance state, and achieve the stable operation of the nonvolatile storage device.

It is to be noted that although in the present embodiment the substrate biasing is performed only in the case of resistance change to high resistance state, the substrate biasing during the initialization so process as described in Embodiment 2 may be performed in addition to the substrate biasing in the present embodiment.

(Embodiment 4)

Next, a nonvolatile storage device according to Embodiment 4 of the present invention shall be described.

In the case where a write process fails for any reason, there is a chance that the write process is completed by performing additional writing through which the same information is written anew. In the case of the nonvolatile storage device using variable resistance elements according to Embodiment 4, the substrate on which the transistor is formed is forward biased through the application of a bias voltage by the substrate bias circuit 110, and a higher voltage than the voltage applied in normal writing is applied in such additional write process, and thus subsequent changing of the resistance state of a variable resistance element can be stabilized.

FIG. 15 shows an example of write characteristics of a single variable resistance element. Here, the resistance change to low resistance state and the resistance change to high resistance state using alternate pulses of −1.5 V and +2.3 V are repeated, but the resistance change to high resistance state fails along the way. As shown in FIG. 15, the low resistance state remains even when +2.3 V normally used for the resistance change to high resistance state is applied two times and even when +2.4 V is applied, but when +2.5 V is applied, resistance change to high resistance state occurs in the same manner as in the normal operation. After the resistance change to high resistance state succeeds with the application of +2.5 V, the resistance change occurs with the usual alternate pulses of −1.5 V and +2.3 V. In the case where the resistance change fails as described above, the resistance change can be stabilized by performing additional writing with an applied voltage that is slightly higher than the normal voltage.

Consequently, in Embodiment 4, a higher voltage than the voltage applied in normal writing is applied by performing forward substrate biasing through the application of a bias voltage by the substrate bias circuit 110 only when the additional write process is executed, thereby stabilizing the changing of the resistance state of the variable resistance element.

It is to be noted that a basic configuration of the nonvolatile storage device according to Embodiment 4 is the same as in the case of Embodiment 1, and thus description thereof shall be omitted. Unlike the nonvolatile storage device according to Embodiment 1 which performs substrate biasing in the normal write cycle, the nonvolatile storage device according to the present embodiment performs substrate biasing only in the case of the additional writing. Hereinafter, description shall be made with reference to FIG. 3 as needed.

As stated above, the nonvolatile storage device according to Embodiment 4 performs the substrate biasing by the substrate bias circuit 110 in the additional write process to be performed when writing fails. In other words, in the additional write process, the nonvolatile storage device performs the write process in Embodiment 1 described previously with reference to FIG. 8.

Figure 16A:
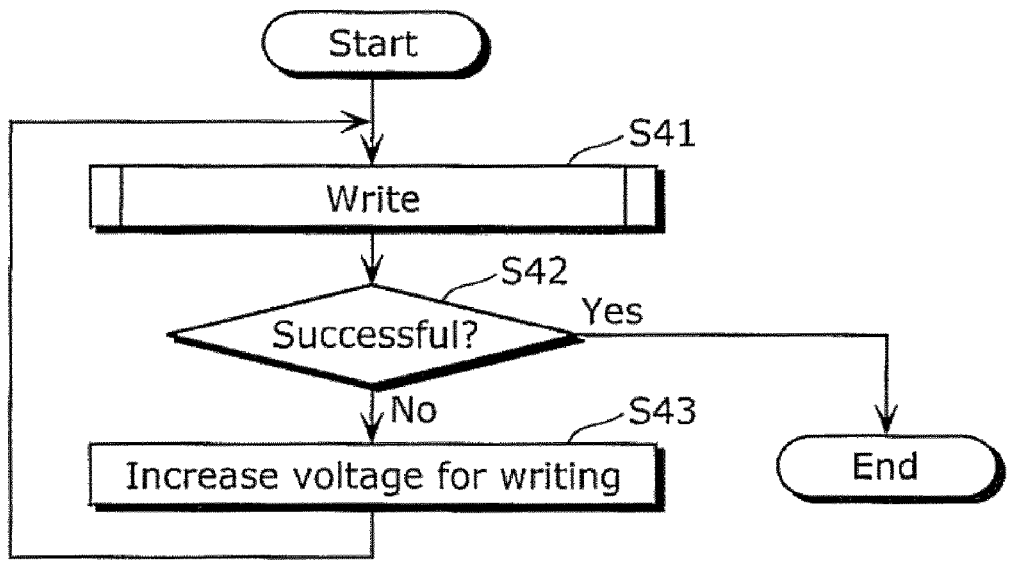
FIG. 16 (a) is a flowchart showing a procedure of a writing method performed by a nonvolatile storage device according to Embodiment 4 of the present invention, and FIG. 16 (b) is a flowchart showing a detailed procedure of a writing step (S41) in FIG. 16 (a).
Figure 16B:
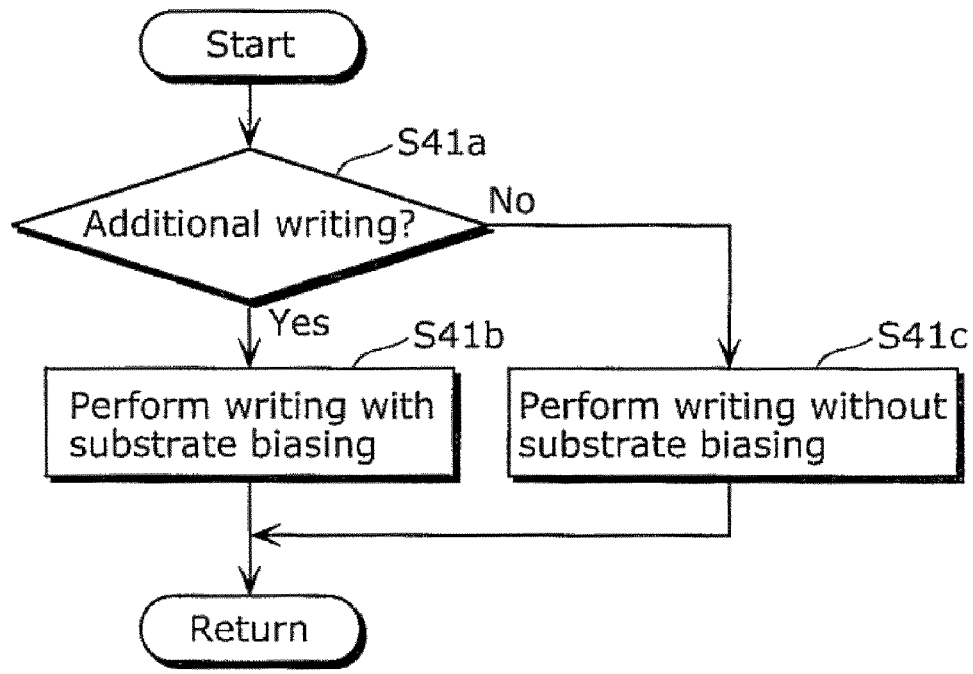

FIG. 16 (*a*) is a flowchart showing a procedure of substrate biasing which is a characteristic operation of the nonvolatile storage device according to the present embodiment. Shown here is the procedure of a method for writing performed by the nonvolatile storage device according to the present invention.

First, the control circuit 109 causes a write cycle with substrate biasing to be performed on the variable resistance element included in a memory cell selected by the selection circuit (the row selection circuit-and-driver 103 and the column selection circuit-and-driver 104), by instructing the write circuit 105. Next, the control circuit 109 reads the information held in the memory cell through the sense amplifier 106, and determines (that is, verifies) whether or not the read data matches the most recent written information (i.e. write is successful) (S42).

As a result, in the case where the read information matches the most recently written information (Yes in S42), the present writing ends, but, in the case where the read data does not match the most recently written data (No in S42), the selection circuit (the row selection circuit-and-driver 103 and the column selection circuit-and-driver 104), under the control of the control circuit 109, makes preparations so that the voltage for writing is increased by a predetermined voltage (for example, 0.1 V) above the most recently applied voltage for writing (difference between the voltage of the word line and the voltage of the bit line) (S43), after which the control circuit 109 again causes a write cycle using the increased voltage for writing (S41). Subsequently, the process for increasing the voltage for writing (S43) and the performance of the write cycle again (S41) are repeated until the writing succeeds (verification is passed).

FIG. 16 (*b*) is a flowchart showing a detailed procedure of the writing step (S41) in FIG. 16 (*a*). In the writing, the control circuit 109 determines whether or not the writing is additional writing (S41*a*). In the case where the writing is an additional writing (Yes in S41*a*), the control circuit 109 causes a write cycle with substrate biasing to be performed, by instructing the substrate bias circuit 110 and the write circuit 105 accordingly (S41*b*). On the other hand, when the writing is not an additional writing (is a first writing) (No in S41*a*), the control circuit 109 causes a write cycle without substrate biasing to be performed, by instructing the substrate bias circuit 110 and the write circuit 105 accordingly (S41*c*).

Accordingly, only in the case where additional writing is performed on the variable resistance element included in the memory cell after the writing to the variable resistance element fails is a bias voltage applied in the forward direction to the semiconductor substrate (well) on which the transistor included in the selection circuit which selects such memory cell is formed.

When the substrate biasing is performed in the additional writing, the effective voltage applied to the variable resistance element can be increased as shown in FIG. 7. Stated differently, it is possible to produce the same effect as when the voltage to be applied in the additional writing is increased as shown in FIG. 15.

In this manner, in the additional write process performed after the write process fails, an additional writing pulse obtained through the application of the bias voltage by the substrate bias circuit 110 is applied to the variable resistance element, thereby enabling the stabilization of subsequent changing of the resistance state of the variable resistance element. As a result, it is possible to realize the nonvolatile storage device which can operate stably.

It is to be noted that although the nonvolatile storage device according to the present embodiment performs substrate biasing only in the additional writing, substrate biasing may also be performed in the initialization process in the same manner as in Embodiment 2.

Furthermore, in addition to the substrate biasing in the additional writing in the present embodiment, substrate biasing may be performed in both the resistance change to high resistance state and the resistance change to low resistance state in the same manner as in Embodiment 1. Furthermore, in addition to the substrate biasing in the additional writing in the present embodiment, substrate biasing may be performed in the case of resistance change to high resistance state in the same manner as in Embodiment 3.

(Embodiment 5)

Next, a nonvolatile storage device according to Embodiment 5 of the present invention shall be described.

In the case of the nonvolatile storage device including variable resistance elements, when a write process is repeatedly performed, there are instances where, after a certain number of cyclings, the resistance of the variable resistance elements ceases to change. In order to prevent such a situation, when the write process is performed a predetermined number of times, it is preferable to apply a higher voltage than the voltage in the normal writing, when a predetermined number of cyclings of the write process is reached. By performing such a process (hereinafter, referred to as refresh process), stable operation of the nonvolatile storage device can be achieved.

The nonvolatile storage device according to Embodiment 5 performs the refresh process by performing forward substrate biasing through the application of a bias voltage by the substrate bias circuit.

It is to be noted that a basic configuration of the nonvolatile storage device according to Embodiment 5 is the same as in the case of Embodiment 1, and thus description thereof shall be omitted. Unlike the nonvolatile storage device according to Embodiment 1 which performs the substrate biasing in all the write cycles, the nonvolatile storage device according to present embodiment performs substrate biasing only in the refresh process. Hereinafter, description shall be made with reference to FIG. 3 as needed.

As stated above, the nonvolatile storage device according to Embodiment 5 executes the forward substrate biasing by the substrate bias circuit 110 in the refresh process. In other words, the nonvolatile storage device performs the write process in Embodiment 1 described previously with reference to FIG. 8, in the refresh process. Such a refresh process is performed in the case where a predetermined number of cyclings of the writing has been performed, such as when the writing process reaches, for example, one million cyclings.

Figure 17:
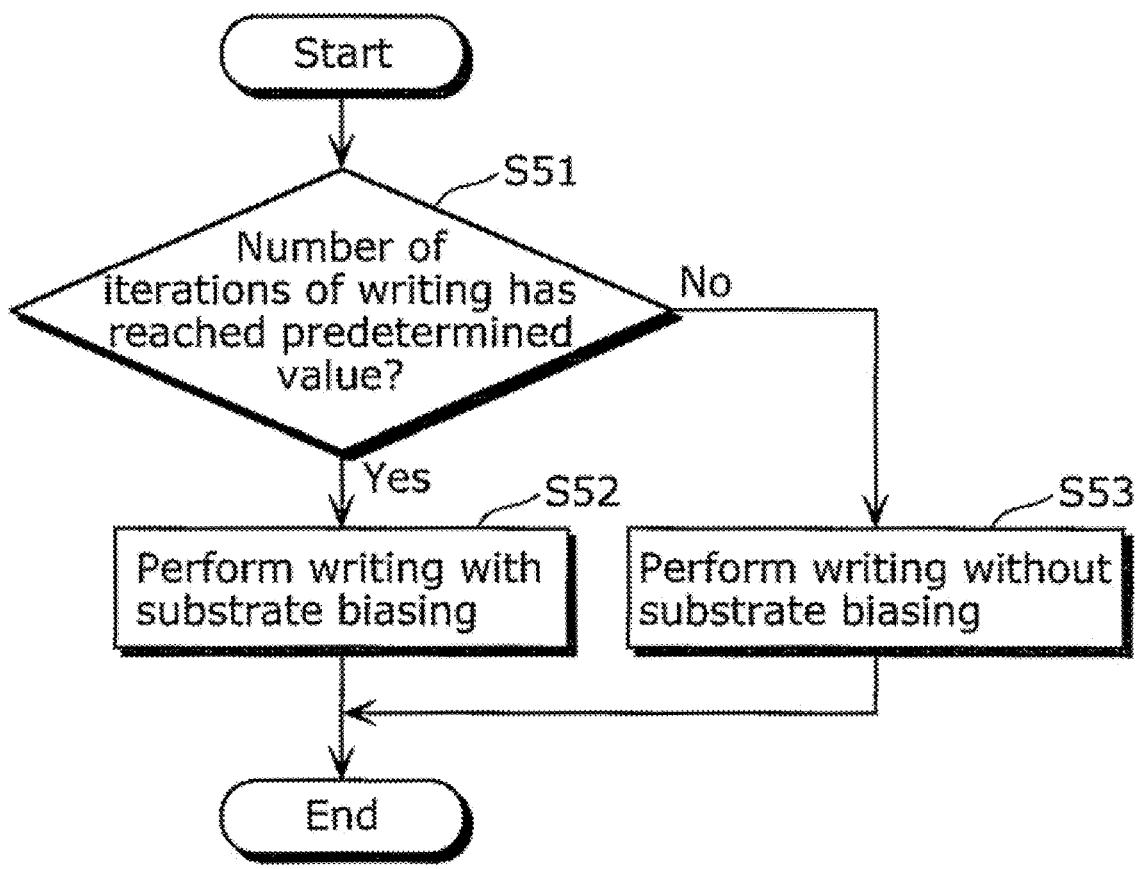
FIG. 17 is a flowchart showing a procedure of a writing method performed by a nonvolatile storage device according to Embodiment 5 of the present embodiment.

FIG. 17 is a flowchart showing a procedure of substrate biasing which is a characteristic operation of the nonvolatile storage device according to the present embodiment. Shown here is the procedure of a method for writing performed by the nonvolatile storage device according to the present invention.

The control circuit 109 determines whether or not the write process for a memory cell identified by the address input circuit 108 has reached a predetermined number of cyclings (for example, one million cyclings), by using a counter included in the control circuit 109 (S51). In the case where it is determined that the write process has reached the predetermined number of cyclings (Yes in S51), the control unit 109 causes a write cycle with substrate biasing to be performed on at least one memory cell (variable resistance element) selected by the selection circuit (the row selection circuit-and-driver 103 and the column selection circuit-and-driver 104), by instructing the substrate bias circuit 110 and the write cycle 105 accordingly (S52). On the other hand, in the case where it is determined that the write process has not reached the predetermined number of cyclings (No in S51), the control unit 109 causes a write cycle without substrate biasing to be performed on at least one memory cell (variable resistance element) selected by the selection circuit (the row selection circuit-and-driver 103 and the column selection circuit-and-driver 104), by instructing the substrate bias circuit 110 and the write cycle 105 accordingly (S53). It is to be noted that after performing the refresh process (the substrate biasing and the writing), the control circuit 109 resets the counter to zero, and performs the same processing (S51 to S53).

As described above, it is possible to increase the voltage applied to the variable resistance element in the refresh process more than the voltage applied to the variable resistance element in the normal write process by performing the forward substrate biasing by the substrate bias circuit 110 in the refresh process, and as a result, it is possible to avoid the situation in which the resistance of the variable resistance element ceases to change. With this, it is possible to realize the nonvolatile storage device which can operate stably.

It is to be noted that although the nonvolatile storage device according to the present embodiment performs substrate biasing only in the refresh process, substrate biasing may also be performed in the initialization process in the same manner as in Embodiment 2.

Furthermore, the number of cyclings of the writing may be counted and held for each of the memory cells, and the refresh process may be performed only on a memory cell for which the number of cyclings of the writing has reached a predetermined value, or the number of cyclings of the writing for the entire memory cell array 202 may be counted and held, and the refresh process may be performed on all of the memory cells included in the memory cell array 202 when the number of cyclings of the writing has reached a predetermined value.

Furthermore, in addition to the substrate biasing in the refresh process in the present embodiment, substrate biasing may be performed in both the resistance change to high resistance state and the resistance change to low resistance state in the same manner as in Embodiment 1. Furthermore, in addition to the substrate biasing at the time of the additional writing in the present embodiment, substrate biasing may be performed in the case of resistance change to high resistance state in the same manner as in Embodiment 3.

Furthermore, in addition to the substrate biasing in the refresh process in the present embodiment, substrate biasing may be performed at the time of additional writing in the same manner as in Embodiment 4.

(Embodiment 6)

Next, a nonvolatile storage device according to Embodiment 6 of the present invention shall be described.

By three-dimensionally stacking the memory cell array 102 in the nonvolatile storage device according to Embodiment 1 shown in FIG. 3 and FIG. 4, it is also possible to realize a nonvolatile storage device having a multi-layer structure. By providing a multi-layered memory cell array configured in such a manner, it is possible to realize an ultra-high-capacity nonvolatile memory. The nonvolatile storage device according to Embodiment 6 includes a multi-layered memory cell array.

Figure 18:
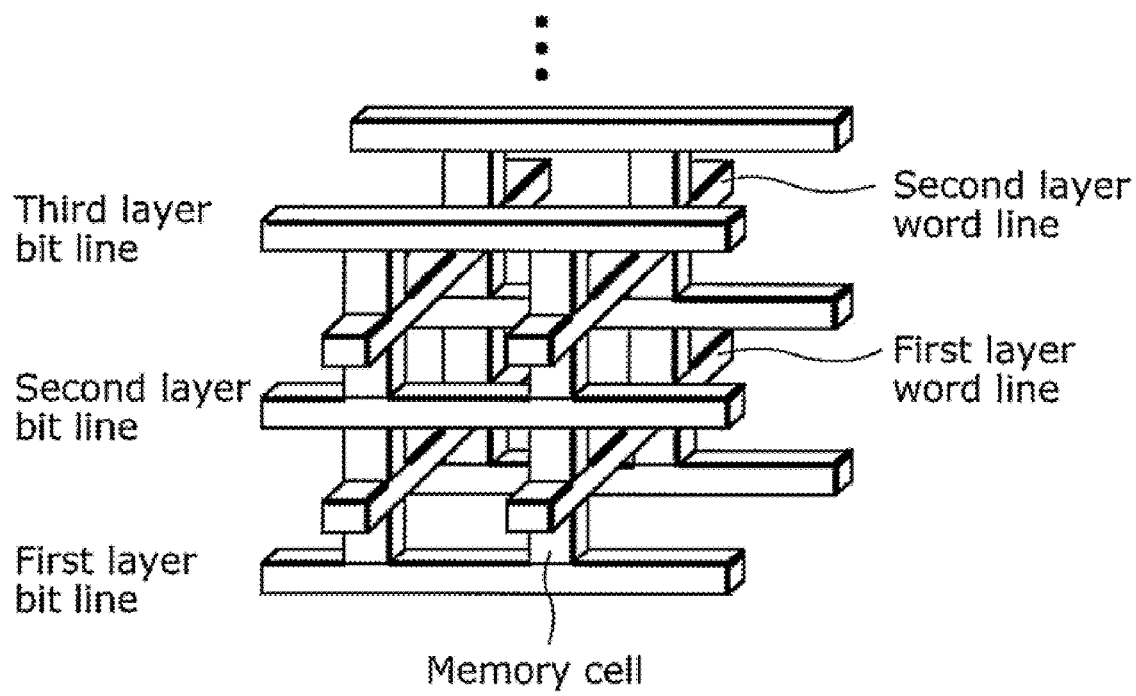
FIG. 18 is a perspective view showing a three-dimensional structure of multiple layers of cross-point memory cells included in a nonvolatile storage device according to Embodiment 6 of the present invention.

FIG. 18 is a perspective view showing a three-dimensional structure of multiple layers of cross-point memory cells included in the nonvolatile storage device according to Embodiment 6 of the present invention. As shown in FIG. 18, bit lines and word lines are arranged alternately in the vertical direction, and memory cells MC are formed by being interposed between the bit lines and the word lines. Specifically, it is a structure obtained by stacking single layers of the cross-point memory cells shown in FIG. 4.

Figure 19:
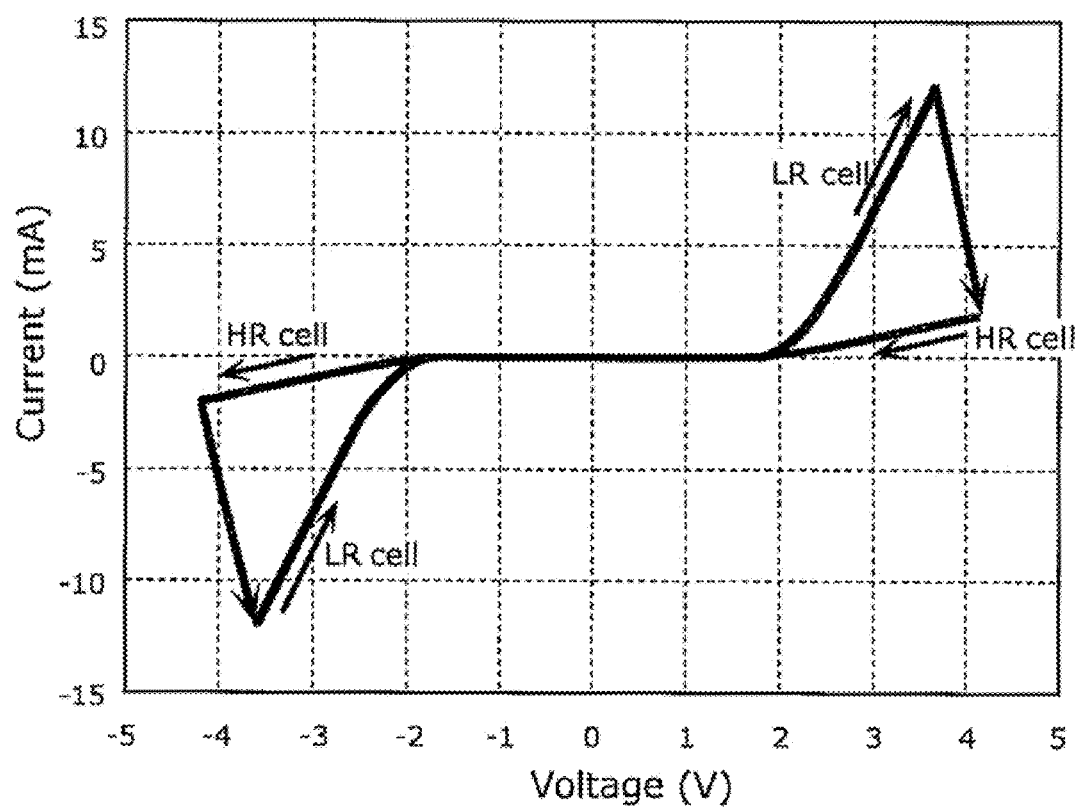
FIG. 19 is a graph showing a current-to-voltage relationship for a memory cell according to Embodiment 6 of the present invention.

FIG. 19 is a graph showing a current-to-voltage relationship for one of the memory cells according to Embodiment 6 of the present invention. In FIG. 19, the horizontal axis represents the voltage applied between a bit line and a word line, and the vertical axis represents the current flowing in the memory cell. Furthermore, "LR cell" denotes the case where the memory cell is in the low resistance state and "HR cell" denotes the case where the memory cell is in the high resistance state. As shown in FIG. 19, when it is assumed that the memory cell is currently in the low resistance state (LR cell), current increases significantly when the voltage rises beyond approximately 2 V. When the voltage rises further and approaches 4 V, the resistance value of the memory cell changes to the high resistance state (HR cell), and the current decreases significantly. On the other hand, when the voltage decreases further and goes below approximately −4 V, the resistance value of the memory cell changes to the low resistance state (LR cell), and the current increases significantly. In this manner, resistance change occurs in both directions.

Figure 20:
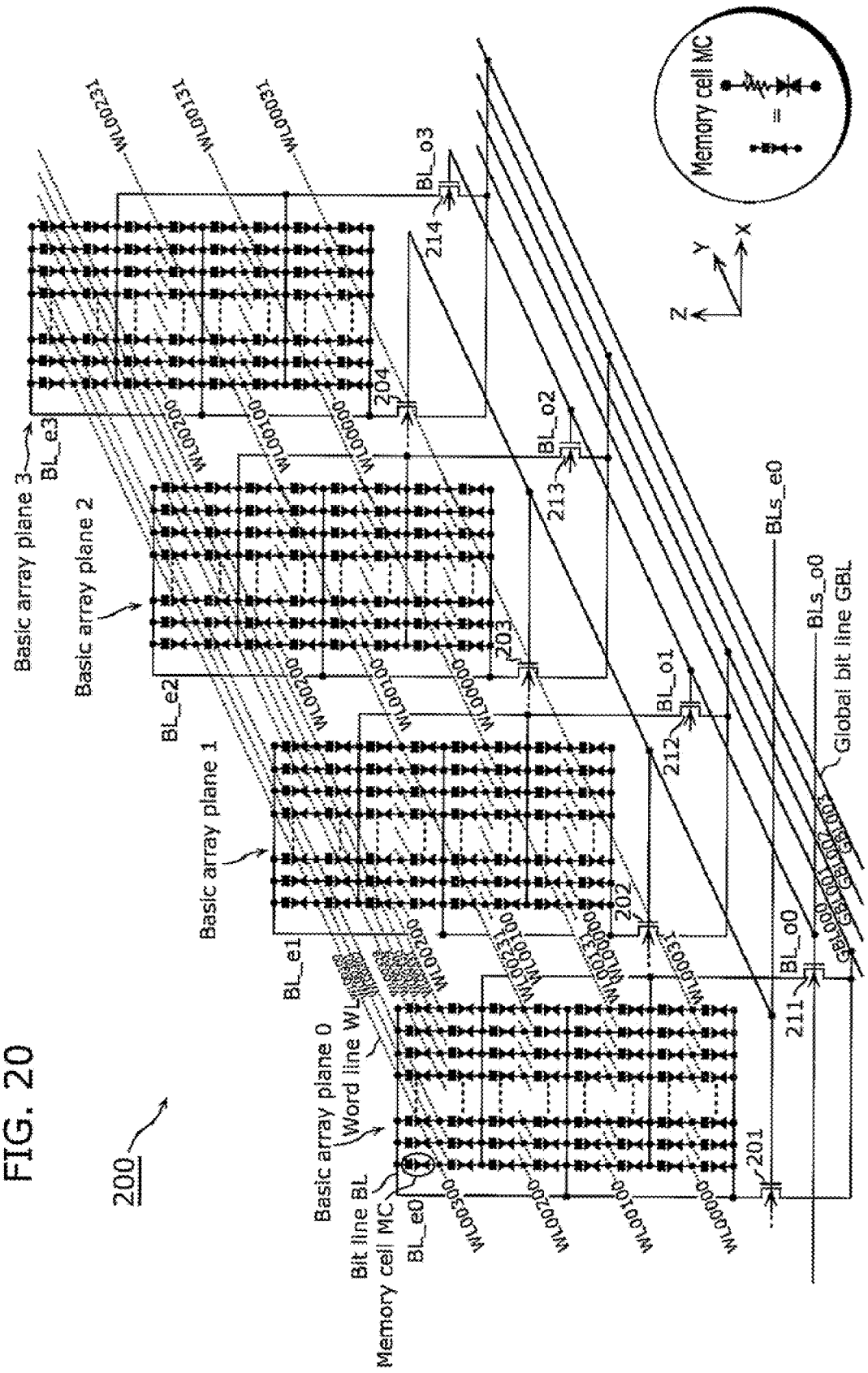
FIG. 20 is a circuit diagram showing a configuration of a memory cell array in the nonvolatile storage device according to Embodiment 6 of the present invention.

FIG. 20 is a circuit diagram showing a configuration of a memory cell array 200 in the nonvolatile storage device according to Embodiment 6 of the present invention. In FIG. 20, it is assumed that the direction in which the bit lines extend is the X-direction, the direction in which the word lines extend is the Y-direction, and the direction in which the bit lines and the word lines are stacked is the Z-direction.

In FIG. 20, the bit lines BL extend in the X-direction and are formed in layers (five layers in FIG. 20), and the word lines WL extend in the Y-direction and are formed in respective layers between the bit lines. In addition, in the memory cell array 200, each of the memory cells MC is formed, at one of the respective positions of cross-points between the bit lines BL and the word lines WL, by being interposed between the bit line BL and the word line WL. It is to be noted that, for the sake of simplifying the diagram, illustration of part of the memory cells MC and part of the word lines has been omitted.

Furthermore, each of basic array planes 0 to 3 is made up of the memory cells MC formed between bit lines and word lines in a group of layers of bit lines BL that are stacked in the Z-direction. The word lines WL are common to the basic array planes 0 to 3. In the example in FIG. 20, in each basic array planes 0 to 3, the memory cells MC are arranged, 32 in the X-direction and 8 in the Z-direction. Furthermore, the memory cell array 200 includes the four of the basic array planes 0 to 3 which are lined up in the Y-direction. However, the number of memory cells in a basic array plane and the number of basic array planes lined up in the Y-direction are not limited to such.

In addition, in each of the basic array planes 0 to 3, an even number of layers of the bit lines BL are connected in common (BL_e0 to BL_e3) and an odd number of layers of the bit lines BL are connected in common (BL_o0 to BL_o3).

In addition, global bit lines GBL000 to GBL003 are formed extending in the Y-direction. Furthermore, in each of the basic array planes 0 to 3, respective ones of first selection transistors 201 to 204 and second selection transistors 211 to 214 are provided. In FIG. 20, it is assumed that the first selection transistors 201 to 204 and the second selection transistors 211 to 214 are configured of NMOS transistors.

The first selection transistors 201 to 204 control, according to an even-layer selection signal BLs_e0, the switching of the electrical connection and non-connection between the global bit lines GBL000 to GBL003 for the respective basic array planes and the even layers of the bit lines BL_e0 to BL_e3 connected in common in the respective basic array planes. The second selection transistors 211 to 214 control, according to an odd-layer selection signal BLs_o0, the switching of the electrical connection and non-connection between the global bit lines GBL000 to GBL003 for the respective basic array planes and the odd layers of the bit lines BL_e0 to BL_e3 connected in common in the respective basic array planes.

A bias voltage is applied to the substrates of the first selecting transistors 201 to 204 and the second selecting transistors 211 to 214 by a substrate bias circuit, as described later.

With this configuration, the above-described multi-layer cross-point structure is realized. In addition, a hierarchical bit line format using the bit lines BL and the global bit lines GBL is realized. Moreover, since the even layers of the bit lines BL and the odd layers of the bit lines BL are connected in common in each of the basic array planes 0 to 3, the number of selection transistors for realizing the hierarchical bit line format can be reduced to two. With this, it is possible to realize a memory cell array having a small array size without increasing the layout surface area.

Figure 21:
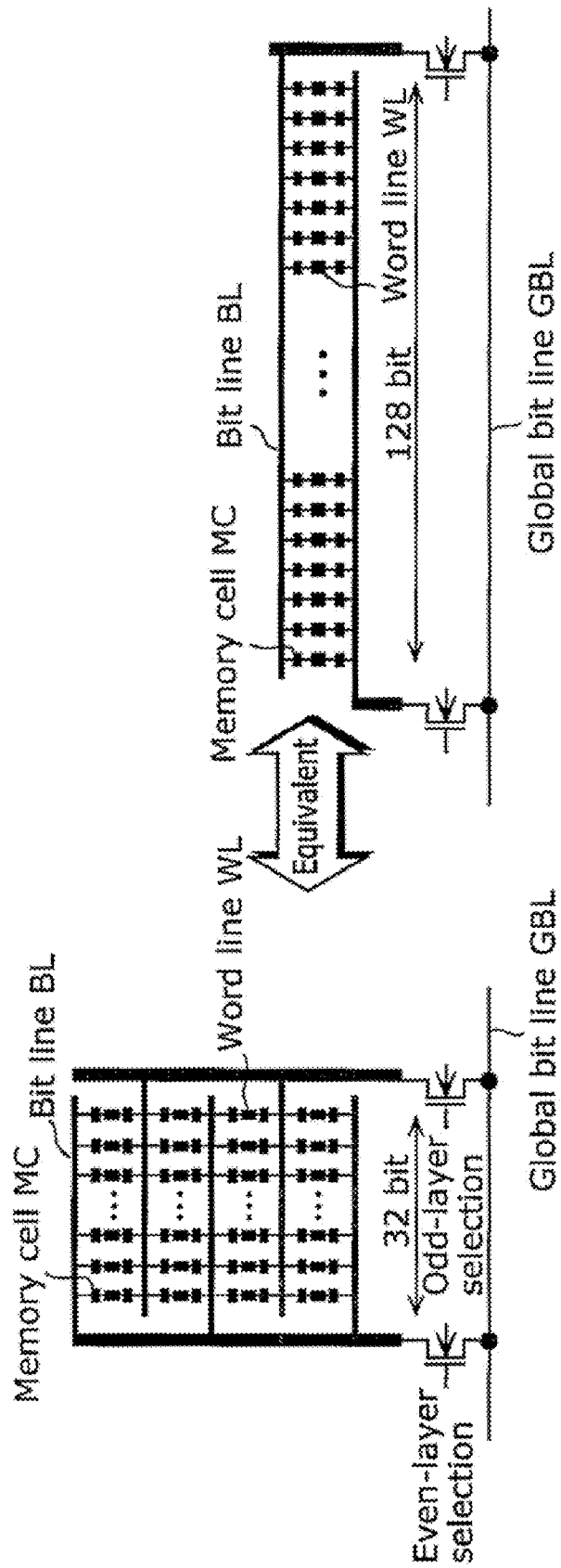
FIG. 21 is a diagram showing an equivalent circuit obtained to when one basic array plane is expanded into a single-layer structure.

FIG. 21 is a diagram showing an equivalent circuit obtained when one of the basic array planes is expanded into a single-layer structure. As shown in FIG. 21, the basic array plane in which 8 layers of 32 memory cells MC each are lined up becomes equivalent to an array in which two layers of 128 memory cells MC each are lined up, and it can be seen that the even-layer bit lines BL and the odd-layer bit lines BL may be connected in common.

Figure 22:
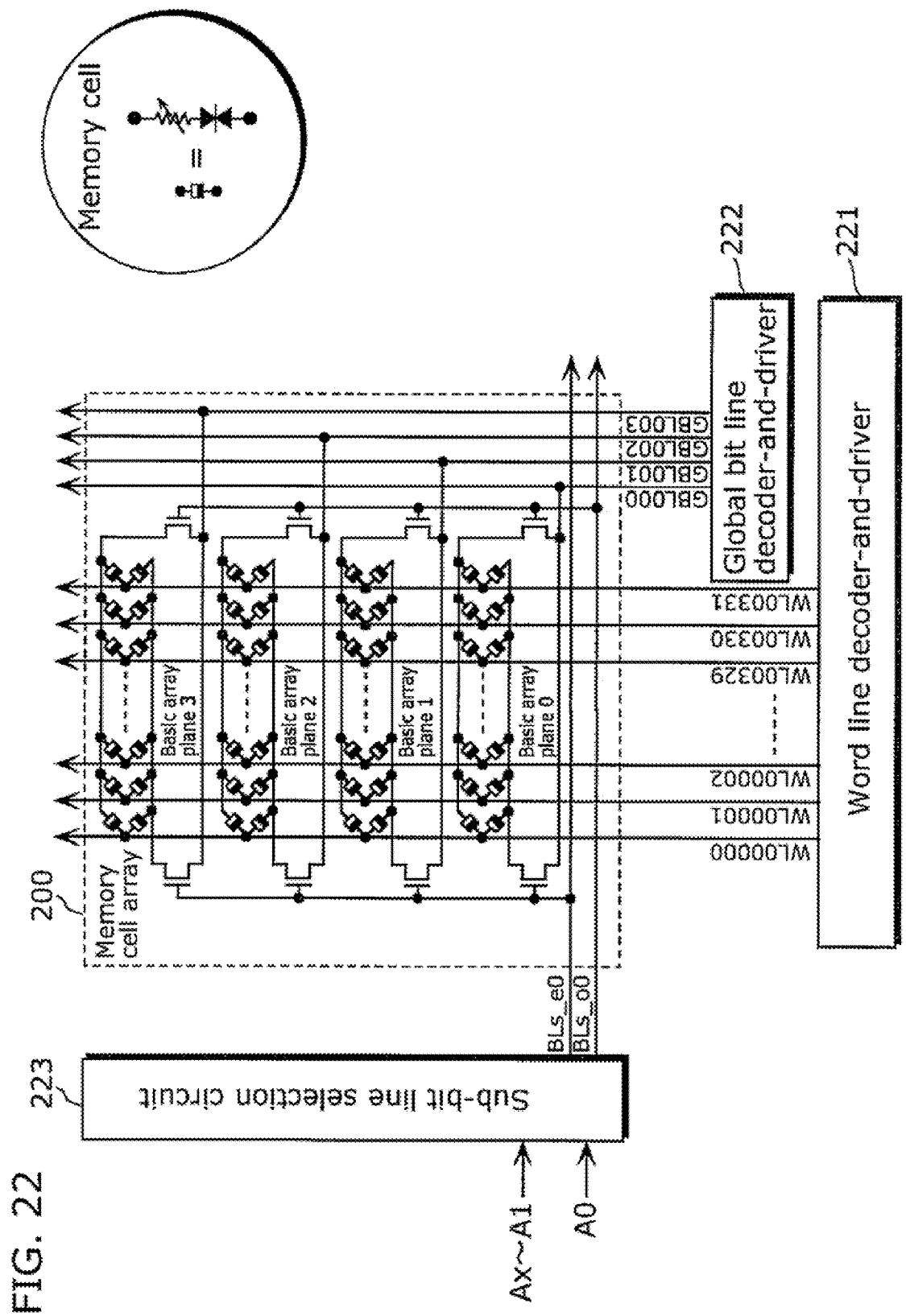
FIG. 22 is a circuit diagram showing the memory cell array in FIG. 20 and neighboring circuits.

FIG. 22 is a circuit diagram showing the memory cell array 200 in FIG. 20 and neighboring circuits. In FIG. 22, a global bit line decoder-and-driver 222 controls the driving of the global bit lines GBL. A sub-bit line selection circuit 223 controls the even-layer selection signal BLs_e0 and the odd-layer selection signal BLs_o0 according to address signals A0 to Ax. A word line decoder-and-driver 221 controls the driving of each of the word lines WL.

Figure 23:
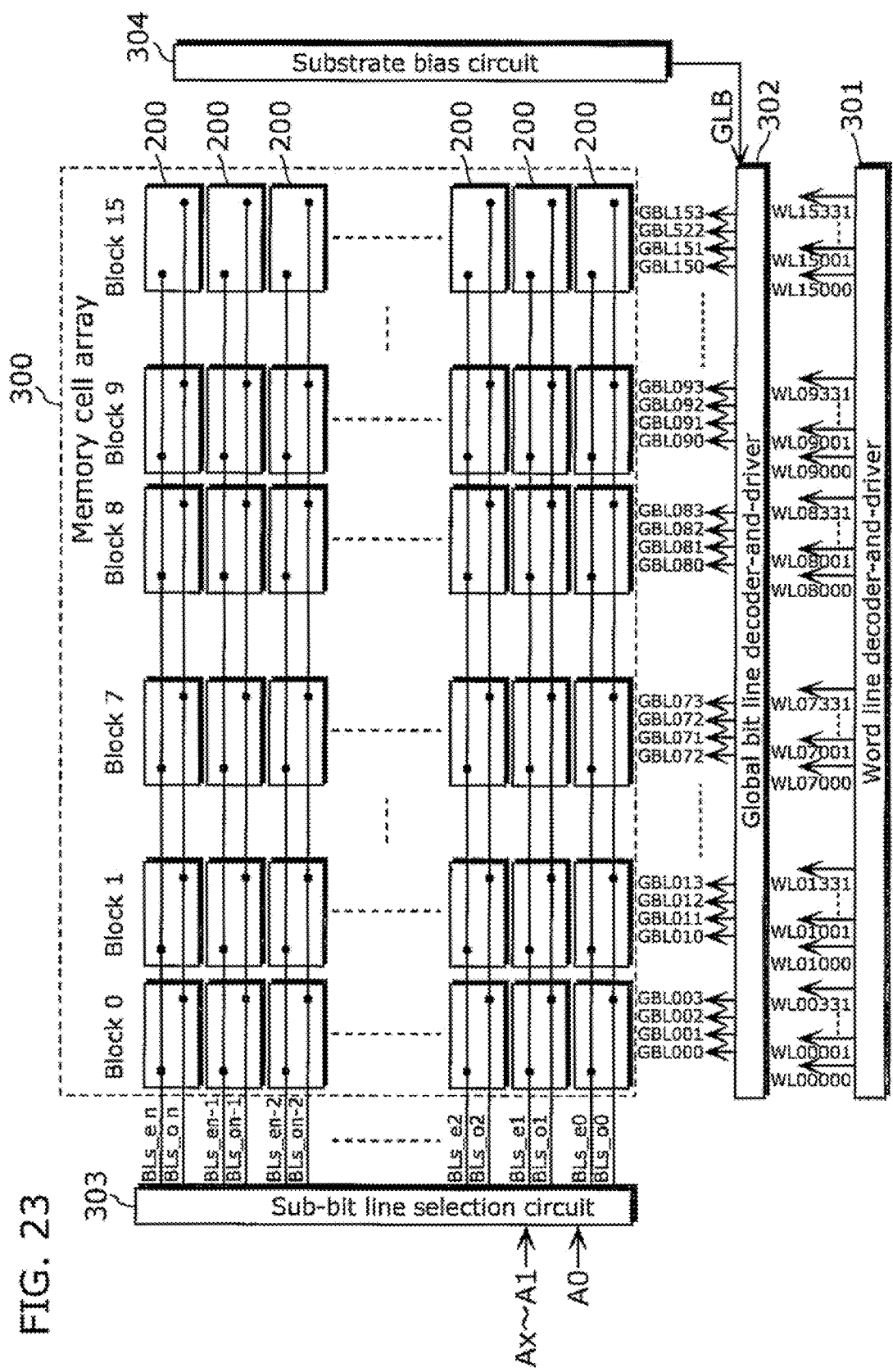
FIG. 23 is a circuit diagram showing a main portion of the nonvolatile storage device according to Embodiment 6 of the present invention.

FIG. 23 is a circuit diagram showing the main portion of the nonvolatile storage device according to Embodiment 6 of the present invention. As shown in FIG. 23, in an actual device, a memory cell array 300 is configured by providing a plurality of the memory cell array 200 in FIG. 20. In the example in FIG. 23, (n+1)×16 of the memory cell array 200 are provided. A word line decoder-and-driver 301 controls the driving of the respective word lines WL, and a global bit line decoder-and-driver 302 controls the driving of the respective global bit lines GBL. A sub-bit line selection circuit 303 controls the even-layer selection signals BLs_e0 to BLs_en and the odd-layer selection signals BLs_o0 to BLs_on for each of the memory cell arrays 200, according to address signals A0 to Ax.

A substrate bias circuit 304 is connected to the global bit line decoder-and-driver 302 via a bias line GLB. As described previously, the substrate bias circuit 304 is a circuit for applying a bias voltage to the substrate on which (i) the selection transistor which controls the switching between the electrical connection and non-connection between the global bit lines for the respective basic array planes and the even layers of the bit lines connected in common in the basic array plane, and (ii) the selection transistor which controls the switching between connection and non-connection between the global bit lines for the respective basic array planes and the odd layers of the bit lines connected in common in the basic array plane, are formed.

Figure 24:
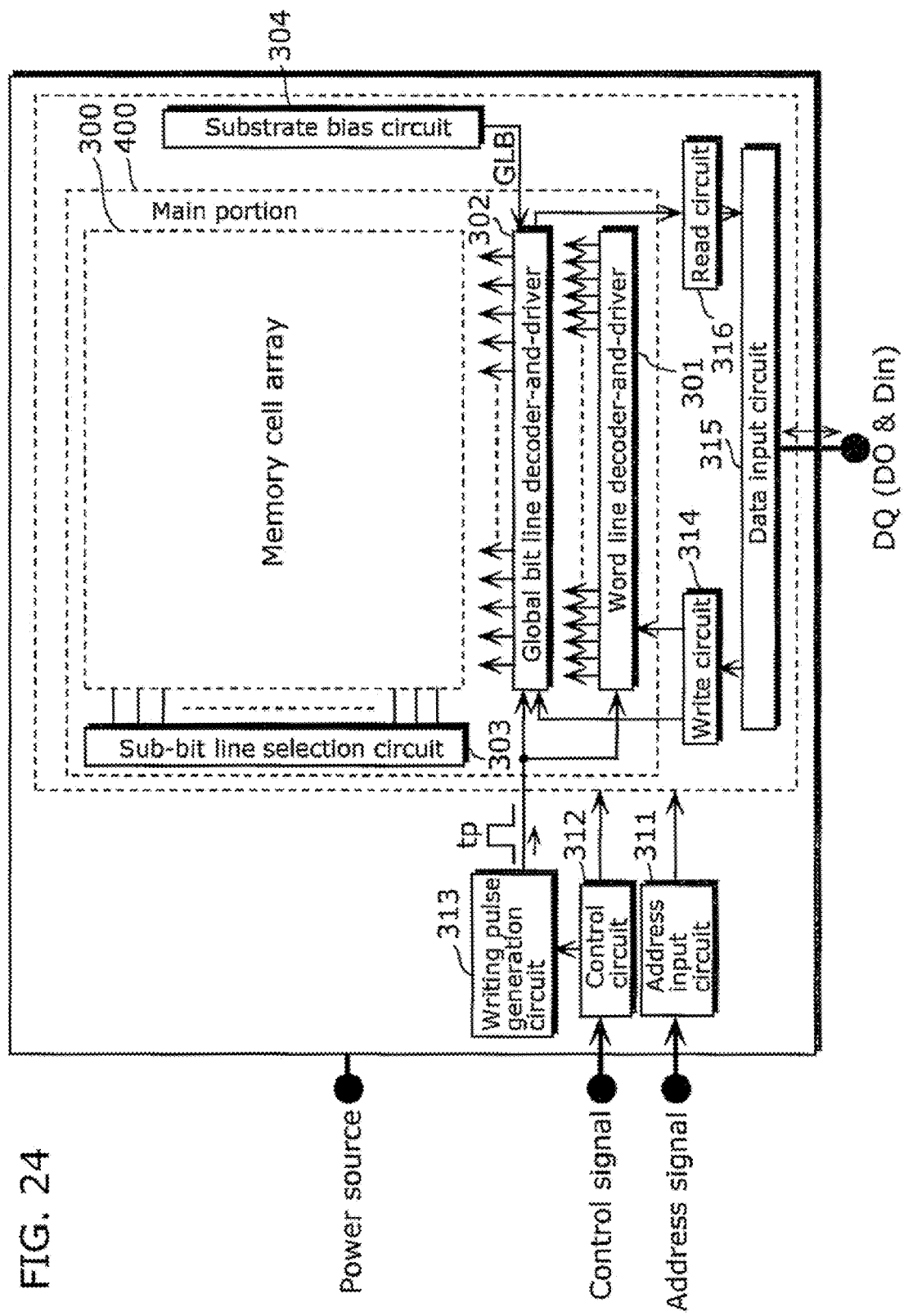
FIG. 24 is a block diagram showing an overall configuration of the nonvolatile storage device according to Embodiment 6 of the present invention.

FIG. 24 is a block diagram showing an overall configuration of the nonvolatile storage device according to Embodiment 6 of the present invention. In FIG. 24, a main portion 400 corresponds to the configuration shown in FIG. 23.

In FIG. 24, an address input circuit 311 temporarily latches address signals from the outside during an erase cycle, a write cycle, or a read cycle, and outputs the latched address signals to the sub-bit line selection circuit 303, the global bit line decoder-and-driver 302, and the word line decoder-and-driver 301. A control circuit 312 receives input signals and outputs signals indicating the states at the time of the erase cycle, the write cycle, the read cycle, and a standby state, in the form of suitable signals, to the sub-bit line selection circuit 303, the global bit line decoder-and-driver 302, the word line decoder-and-driver 301, a write circuit 314, a read circuit 316, and a data input and output circuit 315. Furthermore, the control unit 312 outputs, to a write pulse generation circuit 313, an erase, write, or read pulse generation trigger signal in an erase cycle, write cycle, or read cycle. The write pulse generation circuit 313 generates the respective erase, write, or read time pulses within the erase cycle, write cycle, or read cycle, for an arbitrary time period (tp_E, tp_P, and tp_R), and outputs these to the global bit line decoder-and-driver 302, and the word line decoder-and-driver 301.

Figure 25:
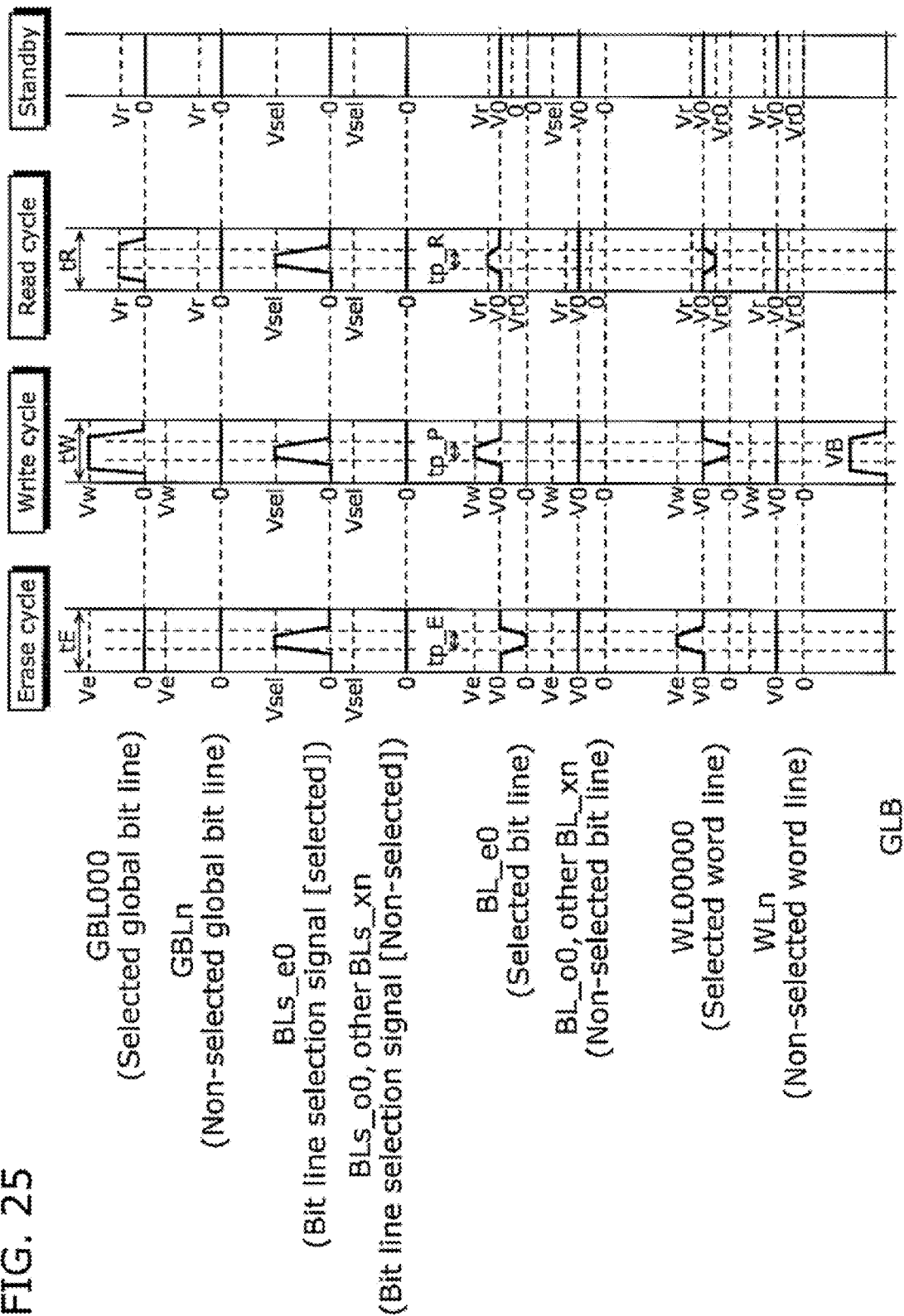
FIG. 25 is timing chart showing example operations of the memory cell array in FIG. 20.

FIG. 25 is a timing chart showing example operations of the memory cell array 200 in FIG. 20. As shown in FIG. 25, the operations of the memory cell 200 are broadly classified into four, namely, the erase cycle, the write cycle, the read cycle, and standby.

First, the write cycle shall be described. In the write cycle, the variable resistance element of a selected memory cell changes from the high resistance state to the low resistance state or from the low resistance state to the high resistance state. First, a write voltage Vw is applied to the selected global bit line (GBL000 in FIG. 25). The write voltage Vw is not applied to the other, non-selected global bit lines. Furthermore, among the bit line selection signals (even-layer selection signal and odd-layer selection signal), a selected bit line selection signal (BLs_e0 in FIG. 25) changes to a voltage Vsel. The rest of the bit line selection signals that are not selected do not change. In addition, the bias voltage VB is applied by the substrate bias circuit 304 to the bias line GLB.

In FIG. 20, the first selection transistors 201 to 204, which are N-type transistors, turn on due to the changing of the even-layer selection signal BLs_e0 to the voltage Vsel. In addition, since the write voltage Vw is applied to the global bit line GBL000, the voltage Vw is applied to the even-layer bit line BL_e0 which is connected in common in the basic array plane 0. In other words, the bit line BL_e0 is the selected bit line. The voltage Vw is not applied to the other, non-selected bit lines.

Subsequently, the voltage of the selected word line (WL00000 in FIG. 25) is caused to change from V0 to 0 V. The voltage to the other, non-selected word lines is left as is at voltage V0.

Furthermore, through the application of a bias voltage to the bias line GLB, forward biasing is performed on the substrate on which the first selection transistor 201, which controls the switching between connection and non-connection between the selected global bit line GBL000 and the selected bit line BL_e0, is formed, and thus the threshold voltage of the first selection transistor 201 can be lowered. With this, the voltage applied to the selected memory cell MC can be increased, and as a result, the resistance of the variable resistance layer of the memory cell MC can be reliably changed.

The basic operation in the erase cycle is the same as that in the write cycle, but is different in that a reverse-direction voltage Ve is applied to the selected memory cell MC. Specifically, since the voltage of the selected global bit line GBL000 remains at 0 V, the voltage of the selected bit line BL_e0 becomes 0 V when the bit line selection signal BLs_e0 changes to the voltage Vsel. On the other hand, the voltage of the selected word line WL00000 changes from V0 to an erase voltage Ve. As a result, the voltage Ve of a reverse-direction as that in the write cycle is applied to the memory cell MC interposed between the selected bit line BL_e0 and the selected word line WL00000, and consequently the resistance value of such memory cell MC changes.

The basic operation in the read cycle is the same as that in the write cycle, but is different in that a read voltage (Vr−Vr0), which is lower than the read voltage Vw, is applied to the selected memory cell MC. Specifically, since the voltage of the selected global bit line GBL000 changes to a voltage Vr, the voltage of the selected bit line BL_e0 becomes Vr when the bit line selection signal BLs_e0 changes to the voltage Vsel. On the other hand, the voltage of the selected word line WL00000 changes from V0 to Vr0. As a result, the voltage (Vr−Vr0) is applied to the memory cell MC interposed between the selected bit line BL_e0 and the selected word line WL00000, and consequently it is possible to perform the reading of the high resistance state or the low resistance state of the variable resistance element of such memory cell MC.

As described above, in the present embodiment, the substrate bias circuit 304 applies a substrate bias voltage to the region of the substrate on which (i) the first selection transistors 201 to 204 which control the switching between the electrical connection and non-connection between the global bit lines and the even layers of bit lines in the basic array planes and (ii) the second selection transistors 211 to 214 which control the switching between connection and non-connection between the global bit lines and the odd layers of bit lines in the basic array planes, are formed. By applying such a substrate bias voltage, the threshold voltage of these selection transistors is lowered and on-resistance is reduced, and thus the voltage applied to the selected memory cell is increased, and as a result, the resistance state of the variable resistance element included in the memory cell is reliably changed.

It is to be noted that although forward biasing is performed on the selection transistor connected to the global bit line and the respective bit lines in the present embodiment, the transistor on which substrate biasing is to be performed is not limited to such and forward substrate biasing may be performed on the various driver transistors in the present embodiment such as, for example, a driving transistor in a final stage in the word line decoder-and-driver 301, global bit line decoder-and-driver 302, and sub-bit line selection circuit 303.

Although the nonvolatile storage device and the method for writing into the same according to the present invention have been described thus far based on Embodiments 1 to 6, the present invention is not limited to such embodiments. Modifications resulting from various modifications to the respective embodiments that can be conceived by those skilled in the art and modifications realized by arbitrarily combining the constituent elements and functions of the respective embodiments without materially departing from the teachings of the present invention are intended to be included in the scope of the present invention.

For example, although the variable resistance layer has a stacked structure of tantalum oxide layers in the respective embodiments described above, the present invention is not limited to such, and any layer which causes resistance change is acceptable. Therefore, for example, the variable resistance layer may be configured of a single layer of a tantalum oxide layer, and may be configured of another metal oxide layer such as a hafnium oxide layer or a silicon oxide layer, instead of a tantalum oxide layer. It is to be noted that, even in the case where a hafnium oxide layer or a silicon oxide layer is used as described above, it is preferable to adopt a stacked structure of a first oxide layer and a second oxide layer which have different oxygen content percentages.

Furthermore, the respective embodiments described above can be arbitrarily combined. Specifically, for example, Embodiment 2 and Embodiment 5 may be combined, and the application of a bias voltage by the substrate bias circuit 110 may be performed in both the initialization process and the refresh process. With this, it is possible to realize a nonvolatile storage device which can maintain more prolonged stable operation. In addition, for example, Embodiment 2 and Embodiment 6 may be combined, and a nonvolatile storage device including multiple layers of cross-point memory cells may perform the application of a bias voltage by the substrate bias circuit 304 in the initialization process.

Furthermore, as shown in FIG. 26 (*a*), each of the memory cells in the respective embodiments described above includes a variable resistance element 501, in which resistance change occurs in both directions, and a bidirectional diode element 502 which is a current controlling element serially connected to the variable resistance element 501. However, the memory cells according to the present invention are not limited to such, and it is possible to adopt unidirectional memory cells as shown in FIG. 26 (*b*), or diode-less memory cells which are configured of only a variable resistance element as shown in FIG. 26 (*c*).

[Industrial Applicability]

A nonvolatile storage device according to the present invention is useful as a storage device or the like used for various electronic devices such as a personal computer and a mobile phone, and especially as a nonvolatile memory with a large storage capacity.

[Reference Signs List]
10 Variable resistance element
11 Substrate
12 Oxide layer
13 Lower electrode
14 Variable resistance layer
14*a* First tantalum oxide layer
14*b* Second tantalum oxide layer
15 Upper electrode
16 Photoresist pattern
17 Element region
100 Nonvolatile storage device
101 Memory main portion
102 Memory cell array
103 Row selection circuit-and-driver
103*a* Transistors
104 Column selection circuit-and-driver
104*a* Transistors
105 Write circuit
106 Sense amplifier
107 Data input and output circuit
108 Address input circuit
109 Control circuit
110 Substrate bias circuit
120 Memory cell array
121 Upper wire
122 Lower wire
123 Upper electrode
124 Variable resistance layer
125 Inner electrode
126 Current controlling layer
127 Lower electrode
200 Memory cell array
201-204 First selection transistors
211-214 Second selection transistors
221 World line decoder-and-driver
222 Global bit line decoder-and-driver
223 Sub-bit line selection circuit
300 Memory cell array
301 World line decoder-and-driver
222 Global bit line decoder-and-driver
303 Sub-bit line selection circuit
304 Substrate bias circuit
311 Address input circuit
312 Control circuit
313 Write pulse generation circuit
314 Write circuit
315 Data input and output circuit
316 Read circuit
400 Main portion
401*a* P-type well (P-type diffusion region)
402*a* First N-type diffusion region (drain)
402*b* Second N-type diffusion region (source)
403*a* Gate insulator film
403*b* Gate electrode
501 Variable resistance element
502 Bidirectional diode element
BL Bit lines
BLB, WLB, GLB Bias line
GBL Global bit lines
MC Memory cell
WL Word lines

The invention claimed is:

1. A nonvolatile storage device comprising:
a substrate;
first wires formed parallel to each other on said substrate;
second wires formed above said first wires so as to be parallel to each other on a plane parallel to a main plane of said substrate and to three-dimensionally cross said first wires;
a memory cell array which includes variable resistance elements each of which (i) is provided to correspond to one of cross-points between said first wires and said second wires, (ii) is interposed between corresponding ones of said first wires and said second wires, and (iii) whose resistance state reversibly changes between a low resistance state and a high resistance state based on a polarity of a voltage applied between the corresponding ones of said first wires and said second wires, the cross-points being three-dimensional;
a selection circuit which (i) includes: a first driving circuit provided with transistors each of which applies a predetermined voltage to a corresponding one of said first wires; and a second driving circuit provided with transistors each of which applies a predetermined voltage to a corresponding one of said second wires, and (ii) selects at least one of said variable resistance elements from said memory cell array, using said first driving circuit and said second driving circuit;
a substrate bias circuit which applies a bias voltage to said substrate on which said transistors provided to said first driving circuit and said second driving circuit are formed; and
a write circuit which provides an electrical signal for writing, to said variable resistance element selected by said selection circuit,
wherein each of said transistors provided to said first driving circuit and said second driving circuit is formed in a region of a first conductivity type within said substrate and includes a first diffusion region of a second conductivity type having reverse polarity to the first conductivity type, a gate, and a second diffusion region of the second conductivity type, and
when the electrical signal for writing is provided by said write circuit to said variable resistance element selected by said selection circuit, said substrate bias circuit applies the bias voltage to said region of the first conductivity type in said substrate on which at least one of said transistors provided to said first driving circuit and said transistors provided to said second driving circuit is formed, the bias voltage being applied in a forward direction with respect to said first diffusion region and said second diffusion region.

2. The nonvolatile storage device according to claim 1,
wherein said substrate bias circuit applies the bias voltage in the case where a resistance value of said variable resistance element selected by said selection circuit is an initial resistance value which is a resistance value in the case where a voltage pulse has not yet been applied since manufacturing of said variable resistance element.

3. The nonvolatile storage device according to claim 1,
wherein said substrate bias circuit applies the bias voltage when causing the resistance state of said variable resistance element selected by said selection circuit to change from the low resistance state to the high resistance state.

4. The nonvolatile storage device according to claim 1,
wherein said substrate bias circuit applies the bias voltage when additional writing is to be performed on said variable resistance element selected by said selection circuit, after writing to change the resistance state of said variable resistance element fails.

5. The nonvolatile storage device according to claim 1,
wherein said substrate bias circuit applies the bias voltage when a number of cyclings of writing into said variable resistance element selected by said selection circuit reaches a predetermined number of cyclings.

6. The nonvolatile storage device according to claim 1,
wherein said region of the first conductivity type in said substrate is a well of the first conductivity type formed in said substrate, and
said substrate bias circuit applies the bias voltage to said well.

7. The nonvolatile storage device according to claim 1,
wherein each of said variable resistance elements includes a metal oxide having a resistance state that reversibly changes between the low resistance state and the high resistance state based on the polarity of the voltage applied between the corresponding ones of said first wires and said second wires.

8. The nonvolatile storage device according to claim 1,
wherein said second wires are bit lines which extend in an X-direction on the plane that is parallel to the main plane of said substrate and are formed into layers stacked in a Z-direction that is perpendicular to the main plane of said substrate,
said first wires are word lines which are formed between the layers of said bit lines and extend in a Y-direction that is orthogonal to the X-direction on the plane that is parallel to the main plane of said substrate,
each of said variable resistance elements is formed, in a corresponding one of cross-points between said bit lines and said word lines, between the corresponding ones of said bit lines and said word lines,
basic array planes are lined-up in the Y-direction and have common word lines, each of said basic array planes being formed by a group of said bit lines that are stacked in the Z-direction,
in each of the basic array planes, even layers of said bit lines are connected in common and odd layers of said bit lines are connected in common,
said nonvolatile storage device further comprises:
global bit lines; and
first selection switching elements, each of which is provided in a corresponding one of said basic array planes, and second selection switching elements, each of which is provided in the corresponding one of said basic array planes,
each of said first selection switching elements controls, according to an even-layer selection signal, switching between electrical connection and non-connection between one of said global bit lines for the corresponding basic array plane and the even layers of said bit lines connected in common in the corresponding basic array plane,
each of said second selection switching elements controls, according to an odd-layer selection signal, switching between electrical connection and non-connection between one of said global bit lines for the corresponding basic array plane and the odd layers of said bit lines connected in common in the corresponding basic array plane, and
said substrate bias circuit further applies the bias voltage to said substrate on which said first selection transistor and said second selection transistor are formed, when an electrical signal for writing is provided to the even layers or the odd layers of said bit lines that are connected in common in one of said basic array planes that is selected.

9. A writing method of writing into variable resistance elements included in a nonvolatile storage device, said method comprising:
selecting at least one variable resistance element from the variable resistance elements included in a memory cell array, using a first driving circuit and a second driving circuit, each of the variable resistance elements (i) being provided, on a substrate, to correspond to one of cross-points between first wires and second wires, (ii) being interposed between corresponding ones of the first wires and the second wires, and (iii) having a resistance state that reversibly changes between a low resistance state and a high resistance state based on a polarity of a voltage applied between the corresponding ones of the first wires and the second wires, the first driving circuit being provided with transistors each of which applies a predetermined voltage to a corresponding one of the first wires, and the second driving circuit being provided with transistors each of which applies a predetermined voltage to a corresponding one of the second wires;
applying a bias voltage to the substrate on which the transistors provided to the first driving circuit and the second driving circuit are formed; and
providing an electrical signal for writing to the variable resistance element selected in said selecting,
wherein each of the transistors provided to the first driving circuit and the second driving circuit are formed in a region of a first conductivity type within the substrate and includes a first diffusion region of a second conductivity type having a reverse polarity to the first conductivity type, a gate, and a second diffusion region of the second conductivity type, and
in said applying, when the electrical signal for writing is provided, in said providing, to the variable resistance element selected in said selecting, the bias voltage is applied to the region of the first conductivity type in the substrate on which at least one of the transistors provided to the first driving circuit and the transistors provided to the second driving circuit is formed, the bias voltage being applied in a forward direction with respect to the first diffusion region and the second diffusion region.

10. The writing method according to claim 9,
wherein in said applying, the bias voltage is applied in the case where a resistance value of the variable resistance element selected in said selecting is an initial resistance value which is a resistance value at a time when a voltage pulse has not yet been applied since manufacturing of the variable resistance element.

11. The writing method according to claim 9,
wherein in said applying, the bias voltage is applied when causing the resistance state of the variable resistance element selected in said selecting to change from the low resistance state to the high resistance state.

12. The writing method according to claim 9,
wherein in said applying, the bias voltage is applied when additional writing is to be performed on the variable resistance element selected in said selecting, after writing to change the resistance state of the variable resistance element fails.

13. The writing method according to claim 9,
wherein in said applying, the bias voltage is applied when a number of cyclings of writing into the variable resistance element selected in said selecting reaches a predetermined number of cyclings.

* * * * *